US007067336B1

(12) United States Patent
Kyogaku et al.

(10) Patent No.: US 7,067,336 B1
(45) Date of Patent: Jun. 27, 2006

(54) ELECTRON-EMITTING DEVICE, ELECTRON SOURCE AND IMAGE-FORMING APPARATUS, AND MANUFACTURING METHODS THEREOF

(75) Inventors: Masafumi Kyogaku, Sagamihara (JP); Hironobu Mizuno, Sagamihara (JP); Takeo Tsukamoto, Atsugi (JP); Hiroyuki Hashimoto, Yokohama (JP); Koki Nukanobu, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/506,289

(22) Filed: Feb. 18, 2000

(30) Foreign Application Priority Data

Feb. 22, 1999 (JP) .......................................... 11-042830
Feb. 8, 2000 (JP) ...................................... 2000-030439

(51) Int. Cl.
*H01L 21/00* (2006.01)

(52) U.S. Cl. ............................ 438/20; 438/23; 438/27; 438/28; 438/29; 257/10; 257/77; 445/50; 445/51

(58) Field of Classification Search .................. 438/20, 438/23, 27, 28, 29; 257/10, 77; 445/50, 51, 445/24; 345/96, 97; 348/100; 359/78, 87, 359/100; 354/94
See application file for complete search history.

(56) References Cited

U.S. PATENT DOCUMENTS 4,904,895 A 2/1990 Tsukamoto et al. ......... 313/336
5,532,544 A 7/1996 Yoshioka et al. ........... 313/310
5,541,752 A * 7/1996 Taniguchi et al. ............ 359/78
5,645,462 A 7/1997 Banno et al. ................. 445/51
5,805,129 A * 9/1998 Inaba et al. ................... 345/97
5,986,389 A 11/1999 Tsukamoto ................. 313/310
6,008,502 A * 12/1999 Deguchi et al. .............. 257/10
6,169,356 B1 1/2001 Ohnishi et al. ............. 313/495
6,184,610 B1 2/2001 Shibata et al. .............. 313/309
6,231,413 B1 * 5/2001 Tsukamoto .................. 445/24
6,246,168 B1 6/2001 Kishi et al. ................. 313/495
6,288,494 B1 9/2001 Tsukamoto et al. ...... 315/169.1
6,435,928 B1 8/2002 Tsukamoto .................. 445/24
6,472,814 B1 10/2002 Yamanobe et al. ......... 313/495
6,626,719 B1 9/2003 Ono et al. .................... 445/24

FOREIGN PATENT DOCUMENTS

EP 0 299 461 1/1989
EP 0 309 242 3/1989
EP 0 536 731 4/1993

(Continued)

OTHER PUBLICATIONS

H. Araki, et al., "Electroforming and Electron Emission of Carbon Thin Films", Journal of the Vacuum Soc. of Japan, vol. 2-6, No. 1, 1983, pp. 22-29 (with English Abstract on p. 22).

(Continued)

*Primary Examiner*—David Nelms
*Assistant Examiner*—Renee R. Berry
(74) *Attorney, Agent, or Firm*—Fitzpatrick, Cella, Harper & Scinto

(57) ABSTRACT

An electron-emitting device having favorable electron emitting characteristic stable for a long time, which is manufactured by a method comprising the steps of disposing an electrically conductive member having a second gap on a substrate, and applying a voltage to the electrically conductive member while irradiating at least the second gap with an electron beam from electron emitting means disposed apart from the electrically conductive member in an atmosphere comprising a carbon compound.

15 Claims, 24 Drawing Sheets

FOREIGN PATENT DOCUMENTS

| | | | |
|---|---|---|---|
| EP | 0 658 924 | | 6/1995 |
| EP | 0 660 357 | A1 | 6/1995 |
| EP | 0 693 766 | | 1/1996 |
| EP | 0 696 813 | | 2/1996 |
| EP | 0 701 265 | B1 | 3/1996 |
| EP | 0 715 329 | | 6/1996 |
| EP | 0 736 890 | | 10/1996 |
| EP | 0 736 892 | | 10/1996 |
| EP | 0 740 342 | | 10/1996 |
| EP | 0 757 371 | | 2/1997 |
| EP | 0 788 130 | A2 | 8/1997 |
| JP | 9-102267 | | 4/1915 |
| JP | 64-19657 | | 1/1989 |
| JP | 1-309242 | | 12/1989 |
| JP | 7-192614 | | 7/1995 |
| JP | 7-235255 | | 9/1995 |
| JP | 8-007749 | | 1/1996 |
| JP | 8-162015 | | 6/1996 |
| JP | 8-264112 | | 10/1996 |
| JP | 8-273523 | | 10/1996 |
| JP | 9-27268 | | 1/1997 |
| JP | 9-27272 | | 1/1997 |
| JP | 9-237571 | | 9/1997 |
| JP | 9-326241 | | 12/1997 |
| JP | 10-3847 | | 1/1998 |
| JP | 10-3848 | | 1/1998 |
| JP | 10-3853 | | 1/1998 |
| JP | 10-3854 | | 1/1998 |
| KR | 97-71896 | | 11/1997 |

OTHER PUBLICATIONS

G. Dittmer, "Electrical Conduction and Electron Emission of Discontinuous Thin Films", Thin Solid Films, 9, 1972 pp. 317–328.

M. Elinson, et al. "The Emission of Hot Electrons and the Field Emissions of Electrons From Tin Oxide", Radio Engineering and Electronic Physics, Jul. 1965, pp. 1290–1298.

C.A. Mead, "Operation of Tunnel–Emission Devices," J. Applied Physics, vol. 32, No. 4, Apr. 1961, pp. 646–652.

C.A. Spindt et al., "Physical Properties of Thin Films of Thin–film Field Emission Cathodes with Molybdenum Cases", J. Applied Physics, vol. 47, No. 12, Dec. 1976, pp. 5248–5263.

M. Hartwell et al., "Strong Electron Emission From Patterned Tin–Indium Oxide Films", IEDM, 1975, pp. 519–521.

W.P. Dyke et al., "Field Emission", Advances in Electronics and Electron Physics, vol. VIII, 1956, pp. 89–185.

Fukano, Y., et al., *Scanning Force/Tunneling Microscopy as a Novel Technique for the Study of nanometer–Scale Dielectric Breakdown of Silicon Oxide Layer*, Jpn. J. Appl. Phys. vol. 32 (1993) pp. 290–293, Part 1, No. 1B, Jan. 1993.

* cited by examiner

ELECTRON-EMITTING DEVICE, ELECTRON SOURCE AND IMAGE-FORMING APPARATUS, AND MANUFACTURING METHODS THEREOF

BACKGROUND OF THE INVENTION

1. Field of the Invention

The present invention relates to an electron-emitting device, an electron source which uses a plurality of the electron-emitting devices, an image-forming apparatus such as a display apparatus, an exposure apparatus or the like which use the electron-emitting device and the electron source, and manufacturing methods thereof.

2. Related Background Art

There are conventionally known electron-emitting devices which are classified roughly into two kinds of electron-emitting devices: thermionic cathode and a cold cathode. The cold cathode is classified into a field emission type (hereinafter referred to as FE type), a metal/insulating layer/metal type (hereinafter referred to as MIM type) and a surface conduction type. Known as the FE type electron-emitting devices are electron-emitting devices which are disclosed by W. P. Dyke & W. W. Dolan, "Field emission," Advance in Electron Physics, 8, 89 (1956), C. A. Spindt, "PHYSICAL Properties of thin-film field emission cathodes with molybdenum cones," J. Appl. Phys., 47, 5248 (1976) or the like.

Known as examples of the MIM type electron-emitting device are electron-emitting devices disclosed by C. A. Mead, "Operation of Tunnel-Emission Devices," J. Apply. Phys., 32, 646 (1961) and so on.

Known as examples of the surface conduction type electron-emitting devices are electron-emitting devices disclosed by M. I. Elinson, Recio. Eng. Electron Phys., 10, 1290 (1965) and so on.

The surface conduction type electron-emitting devices utilize a phenomenon where electrons are emitted by supplying a current to a thin small area film formed on a substrate in parallel with a surface of the film. Reported as the surface conduction type electron-emitting devices are devices disclosed by Elinson, et al. described above which uses thin films of $SnO_2$, devices which use thin films of Au [G. Dittmer: "Thin Solid Films," 9, 317 (1972)], devices which use thin films of $In_2O_3/SnO_2$ [M. Hartwell and C. G. Fonstad: "IEEE Trans. ED Conf." 519 (1975)], devices which use thin films of carbon [Hisashi Araki, et. al.: shinku (Vacuum), Vol. 26, No. 1, p.22 (1983)] or the like.

FIG. 11 schematically shows a configuration of the device disclosed by M. Hartwell described above as a typical example of the surface conduction type electron-emitting device. In FIG. 11, reference numeral 111 denotes a substrate. Reference numeral 114 designates an electrically conductive film which is composed of a thin film of a metal oxide formed by sputtering as an H-shaped pattern and an electron emitting region 115 is formed by an current supply treatment. In FIG. 11, a spacing L of 0.5 to 1 mm is reserved between element electrodes and W' is set at 0.1 mm.

It is conventionally general before emitting electrons to form the electron emitting region 115 on the surface conduction type electron-emitting device by subjecting the electrically conductive film 114 to a energization treatment called "forming". Speaking concretely, a DC voltage or pulse voltage is applied across both ends of the electrically conductive film 114 to locally break, deform or degenerate the electrically conductive film 114, thereby forming the electron emitting region 115 which is in an electrical condition of high resistance. At this stage, the electrically conductive film 114 is partially cracked and forms a gap.

The surface conductive electron-emitting device which has the gap formed as described above emits electrons from the electron emitting region 115 (vicinities of the gap) when a current is supplied to the device by applying a voltage to the electrically conductive film 114.

It is possible to compose an image-forming apparatus by forming a plurality of electron-emitting devices such as that described above on an electron source substrate and combining it with an image-forming member composed of a fluorescent material or the like.

However, the electron-emitting device disclosed by M. Hartwell described above is not always satisfactory in its stable electron-emitting characteristic and electron-emitting efficiency, whereby it is extremely difficult under to provide an image-forming apparatus which has high luminance and excellent operating stability.

Accordingly, a treatment called activation treatment may be carried out as disclosed by Japanese Patent Application Laid-Open Nos. 08-264112, 08-162015, 09-027268, 09-027272, 10-003848, 10-003847, 10-003853 and 10-003854. The activation treatment step is a step of remarkably changing a device current If and an emission current Ie.

Like the forming treatment, the activation step can be carried out by repeating application of a pulse voltage to device in an atmosphere containing an organic substance. This treatment allows a film comprising of carbon and/or carbon compounds is deposited from the organic substance existing in the atmosphere onto at least the electron emitting region to remarkably change the device current If and the emission current Ie, thereby making it possible to obtain a more favorable electron emitting characteristic.

An example of conventional manufacturing method of the electron-emitting device will be described with reference to FIGS. 19A through 19D.

First, a first electrode 2 and a second electrode 3 are disposed on a substrate 1 (FIG. 19A).

Then, an electrically conductive film 4 is disposed to connect the first and second electrodes. (FIG. 19B)

Then, the forming treatment described above is carried out. Speaking concretely, a second gap 6 is formed in a portion of the electrically conductive film 4 by flowing a current through the electrically conductive film (FIG. 19C).

Furthermore, the activation treatment described above is carried out. Speaking concretely, by supplying a voltage to the electrically conductive film, a carbon film 10 is formed on the substrate 1 within the second gap 6 and the electrically conductive film 4 in the vicinity of the gap 6. This activation treatment forms a first gap 7 which is narrower than the second gap, thereby forming an electron emitting region 5 (FIG. 19D).

SUMMARY OF THE INVENTION

A manufacturing method of the electron-emitting device according to the present invention comprises: a step of disposing an electrically conductive member having a second gap on a substrate; a step of irradiating at least the second gap with an electron beam in an atmosphere comprising carbon compounds from electron emitting means disposed apart from the electrically conductive member; and a step of applying a voltage to the electrically conductive member in an atmosphere containing a carbon compounds.

Furthermore, the manufacturing method of the electron-emitting device according to the present invention comprises: a step of disposing a first and second electrically conductive members on a substrate with a second gap interposed; a step of irradiating at least the second gap with an electron beam in an atmosphere comprising carbon compounds from electron emitting means disposed apart from the electrically conductive members; and a step of applying a voltage to the first and second electrically conductive members.

Furthermore, the manufacturing method of the electron-emitting device according to the present invention comprises: a step of disposing an electrically conductive member having a second gap on a substrate; and a step of applying a voltage to the electrically conductive member while irradiating at least the second gap with electron beam in an atmosphere comprising carbon compounds from electron emitting means disposed apart from the electrically conductive member.

Furthermore, the manufacturing method of the electron-emitting device according to the present invention comprises: a step of disposing a first and second electrically conductive members on a substrate with a second gap interposed; and a step of applying a voltage to the first and second electrically conductive members while irradiating at least the second gap with an electron beam in an atmosphere comprising carbon compounds from electron emitting means disposed apart from the electrically conductive members.

Furthermore, the manufacturing method of the electron-emitting device according to the present invention comprises: a step of disposing an electrically conductive member with a second gap on a substrate; and a step of irradiating at least the second gap with an electron beam in an atmosphere comprising a carbon compound from electron emitting means disposed apart from the electrically conductive member during a period where a voltage is applied to the electrically conductive member.

Furthermore, the manufacturing method of the electron-emitting device according to the present invention comprises: a step of disposing a first and second electrically conductive members with a second gap interposed on a substrate, and a step of irradiating at least the second gap with an electron beam in an atmosphere comprising the carbon compound from the electron emitting means disposed apart from the electrically conductive members during a period where a voltage is applied to the first and second electrically conductive members.

Moreover, the manufacturing method according to the present invention described above is applicable preferably to a manufacturing method of an electron source which has a plurality of electron-emitting devices.

In addition, the manufacturing method according to the described above present invention is applicable preferably to a manufacturing method of an image-forming apparatus which has an electron source and an image-forming member.

The electron-emitting device according to the present invention is characterized in that it is an electron-emitting device which has a carbon film having specific resistance of 0.001 Ωm or lower.

Furthermore, the electron-emitting device according to the present invention described above is applicable preferably to an electron source which has a plurality of electron-emitting devices.

Moreover, the electron-emitting device according to the present invention described above is applicable preferably to an image-forming apparatus which has an electron source and an image-forming member.

BRIEF DESCRIPTION THE DRAWINGS

FIGS. 1A and 1B are schematic diagrams showing a configuration of preferable embodiment of the electron-emitting device according to the present invention;

FIGS. 2A, 2B, 2C, and 2D are schematic diagrams showing manufacturing steps of the electron-emitting device show FIGS. 1A and 1B;

Figure 5:
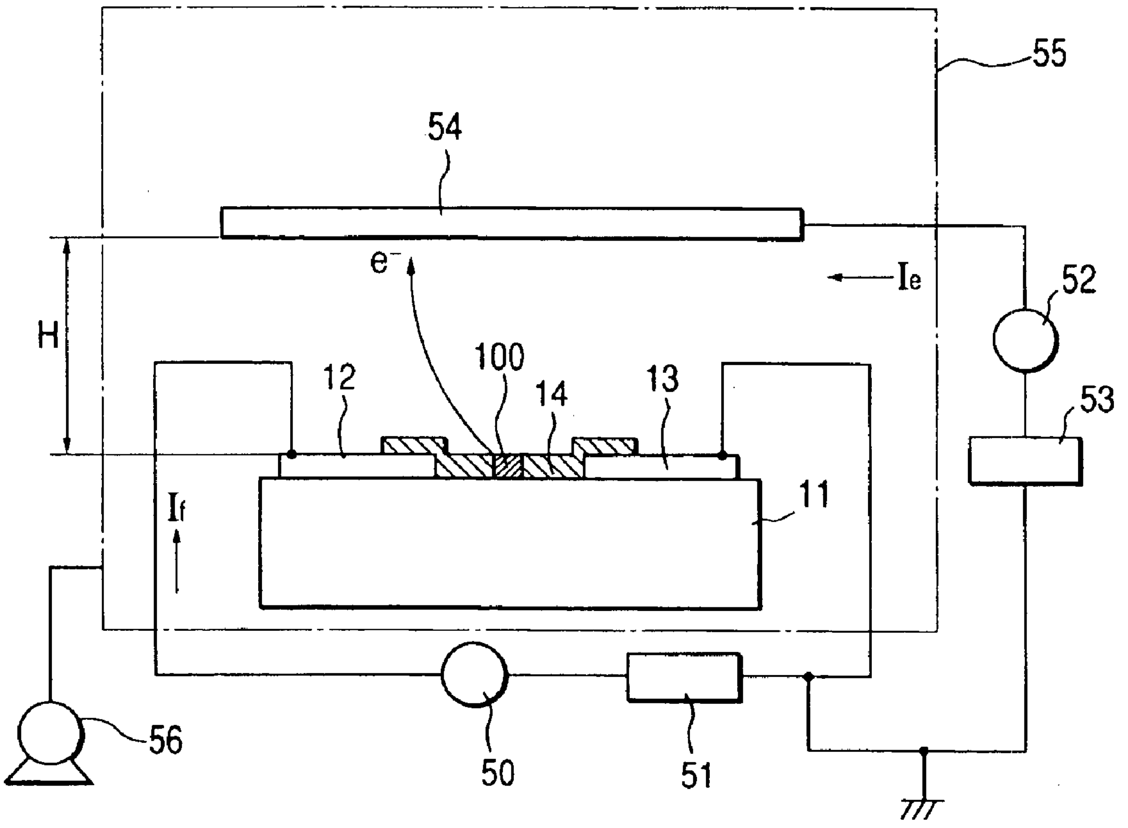
Figure 6:
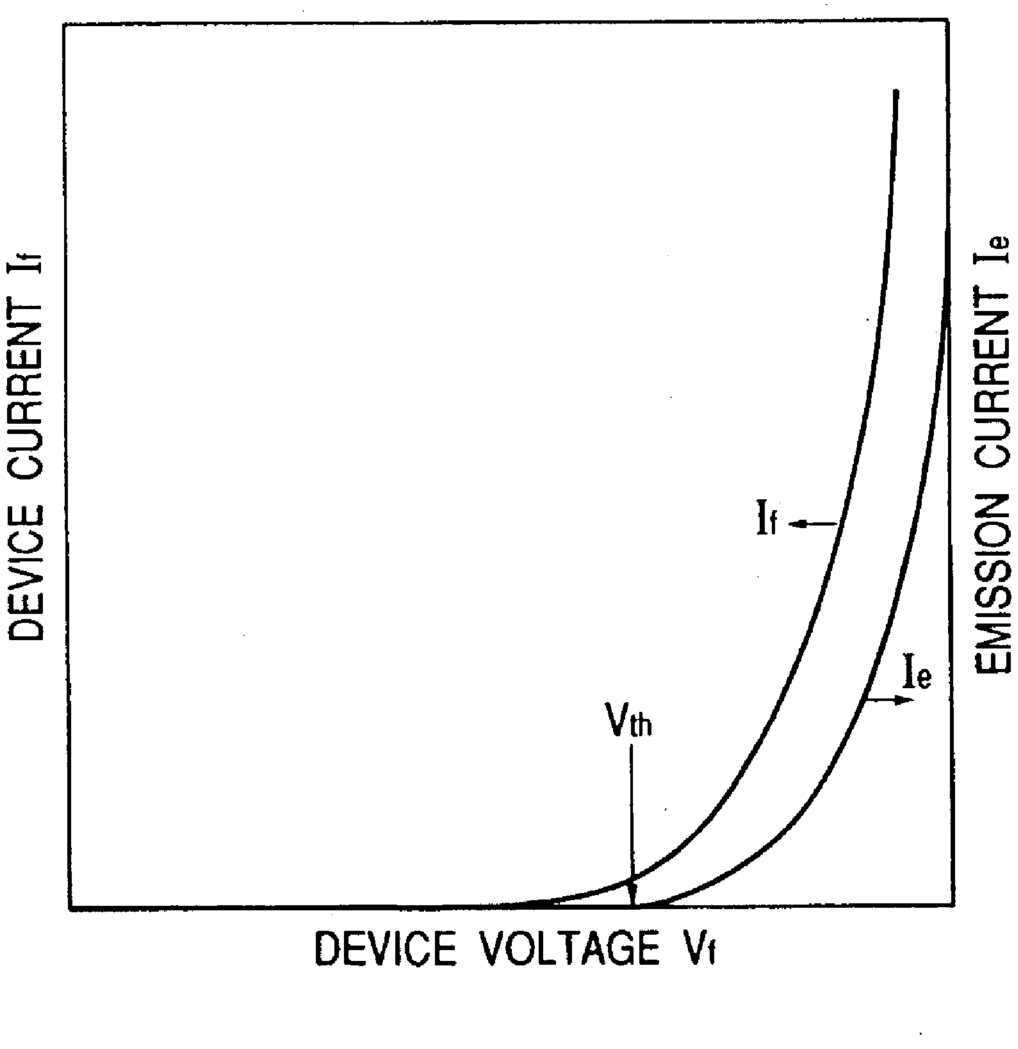
Figure 7A:
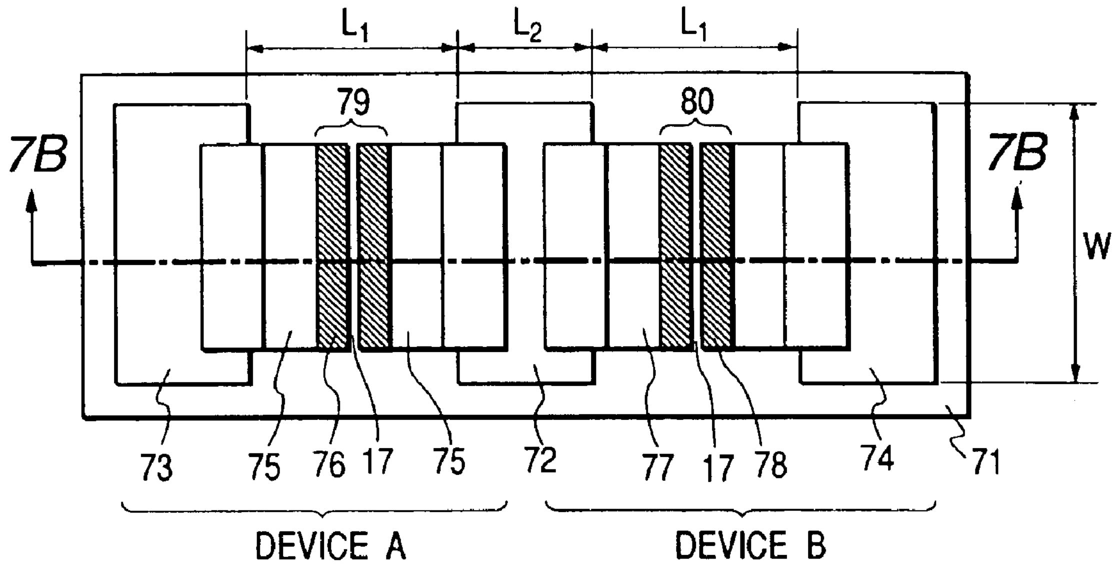
Figure 7B:
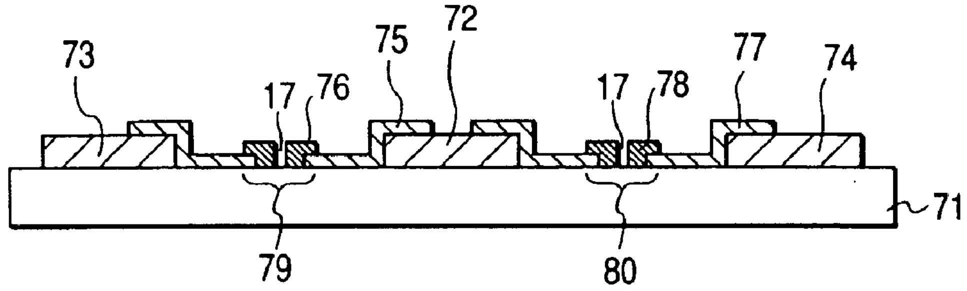
Figure 8A:
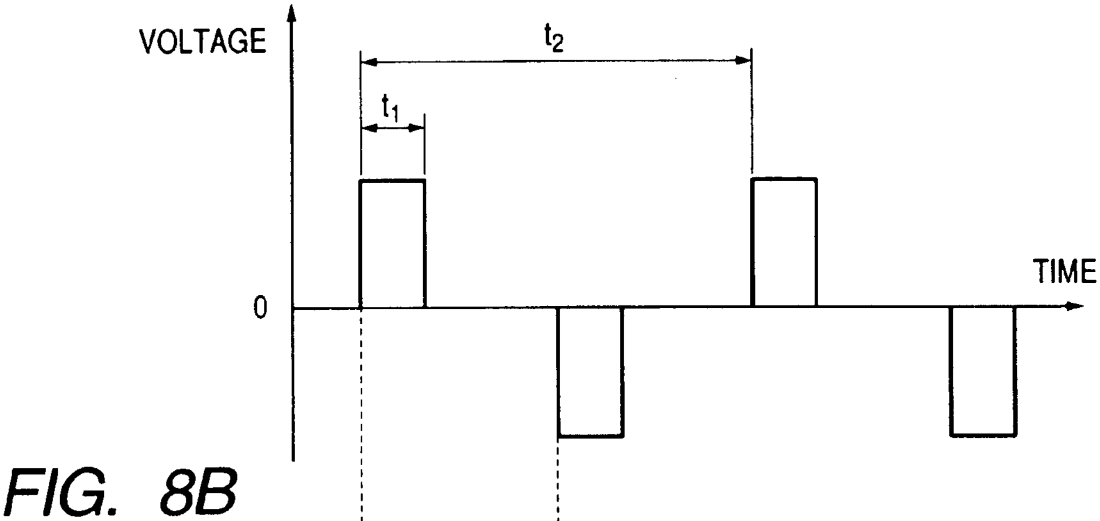
Figure 8B:
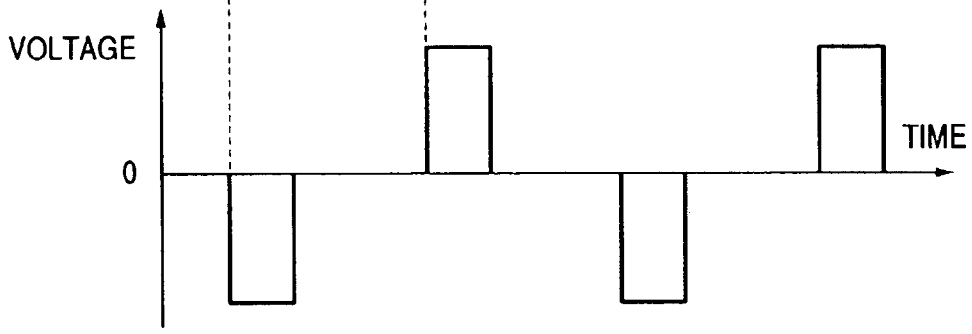
Figure 9A:
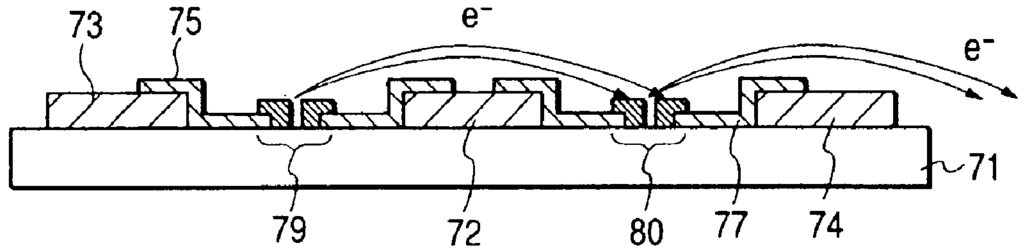
Figure 9B:
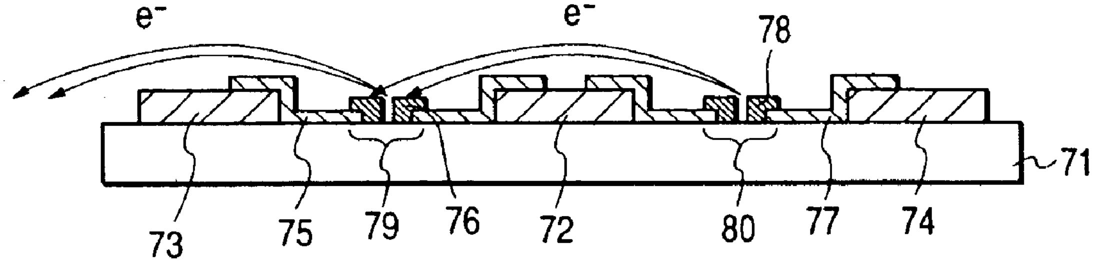
Figure 10A:
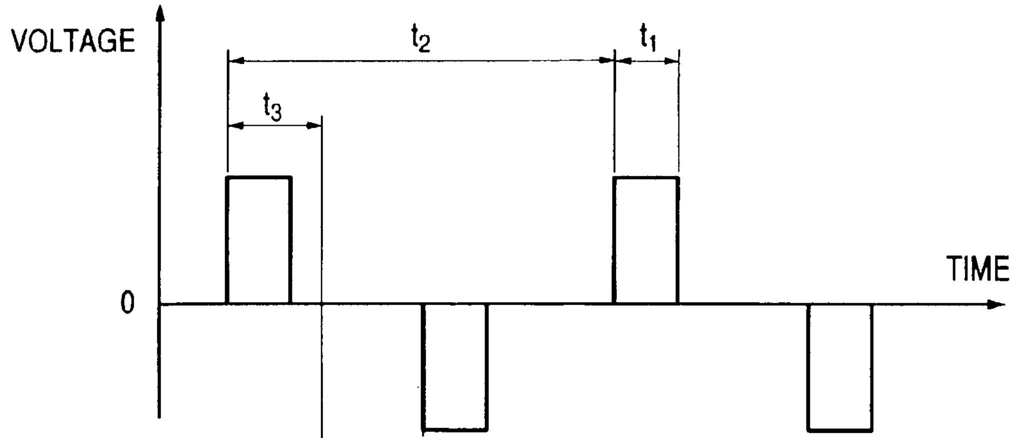
Figure 10B:
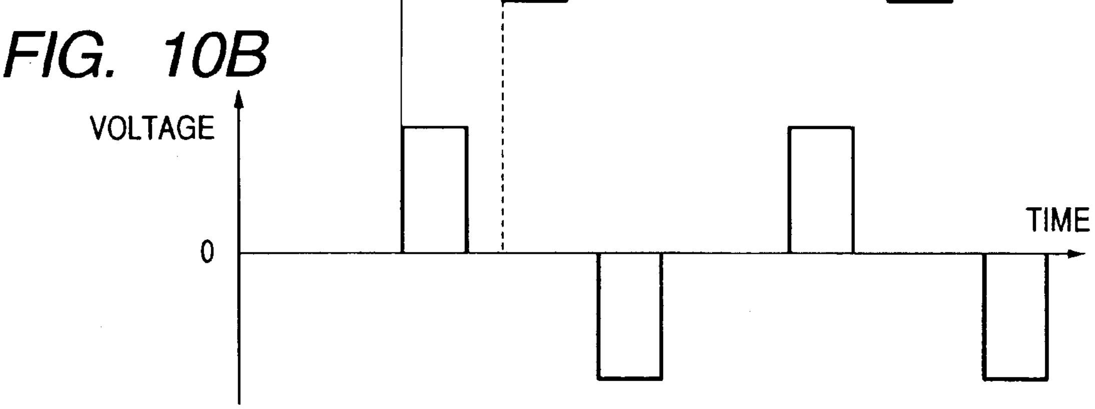
Figure 11:
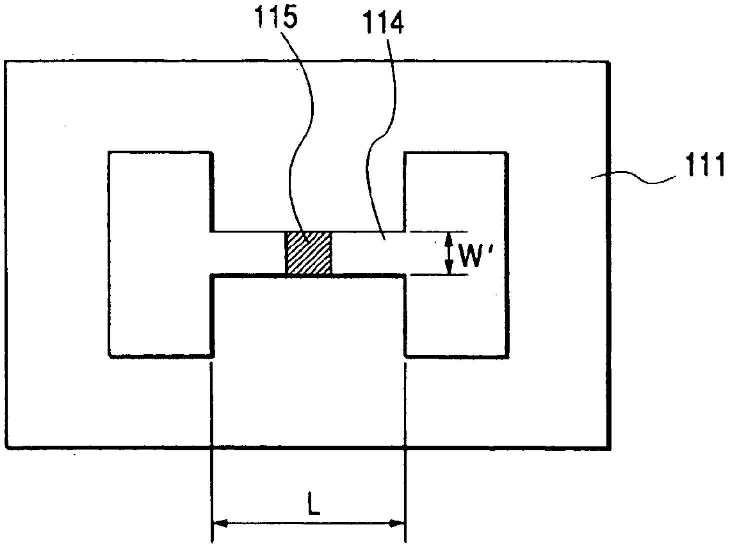
Figure 12:
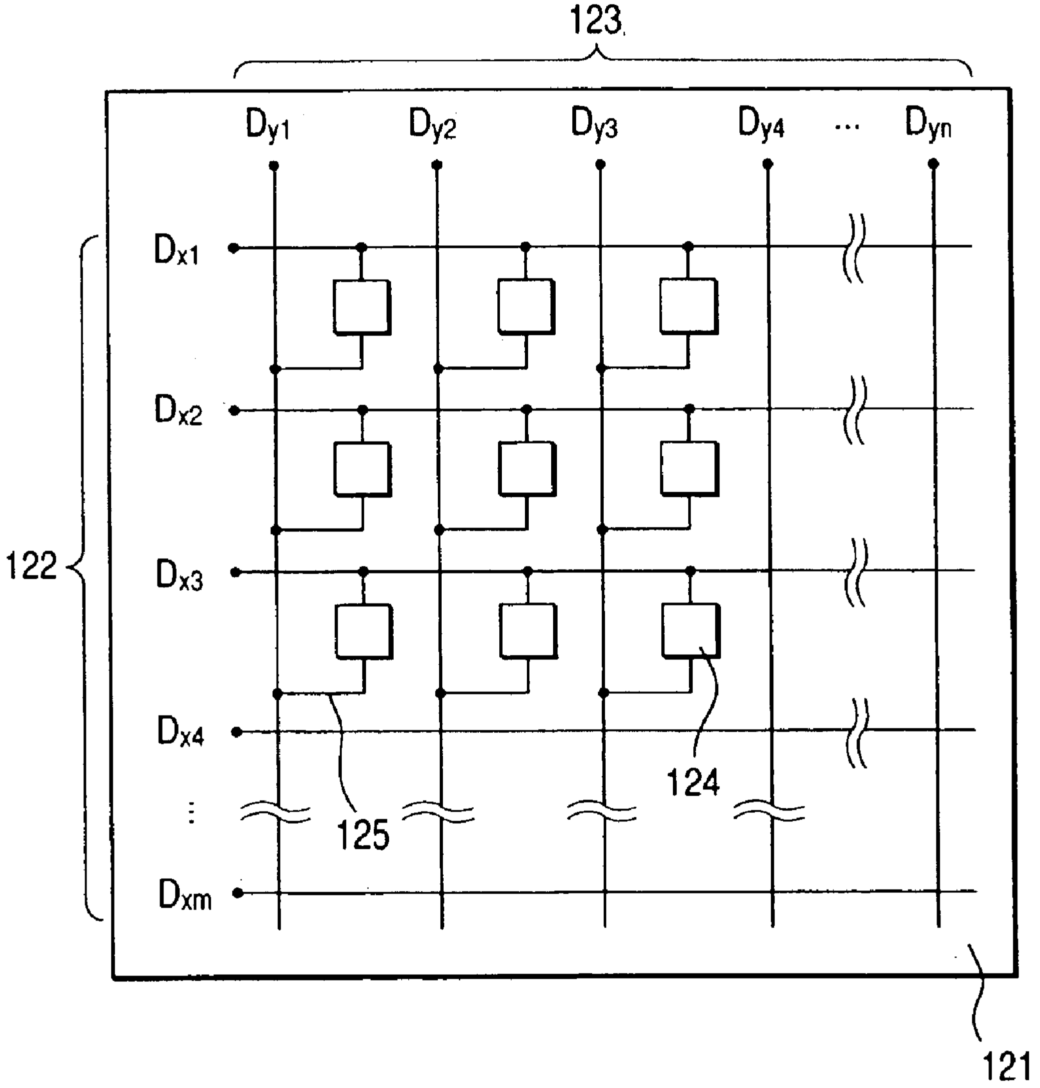
Figure 13:
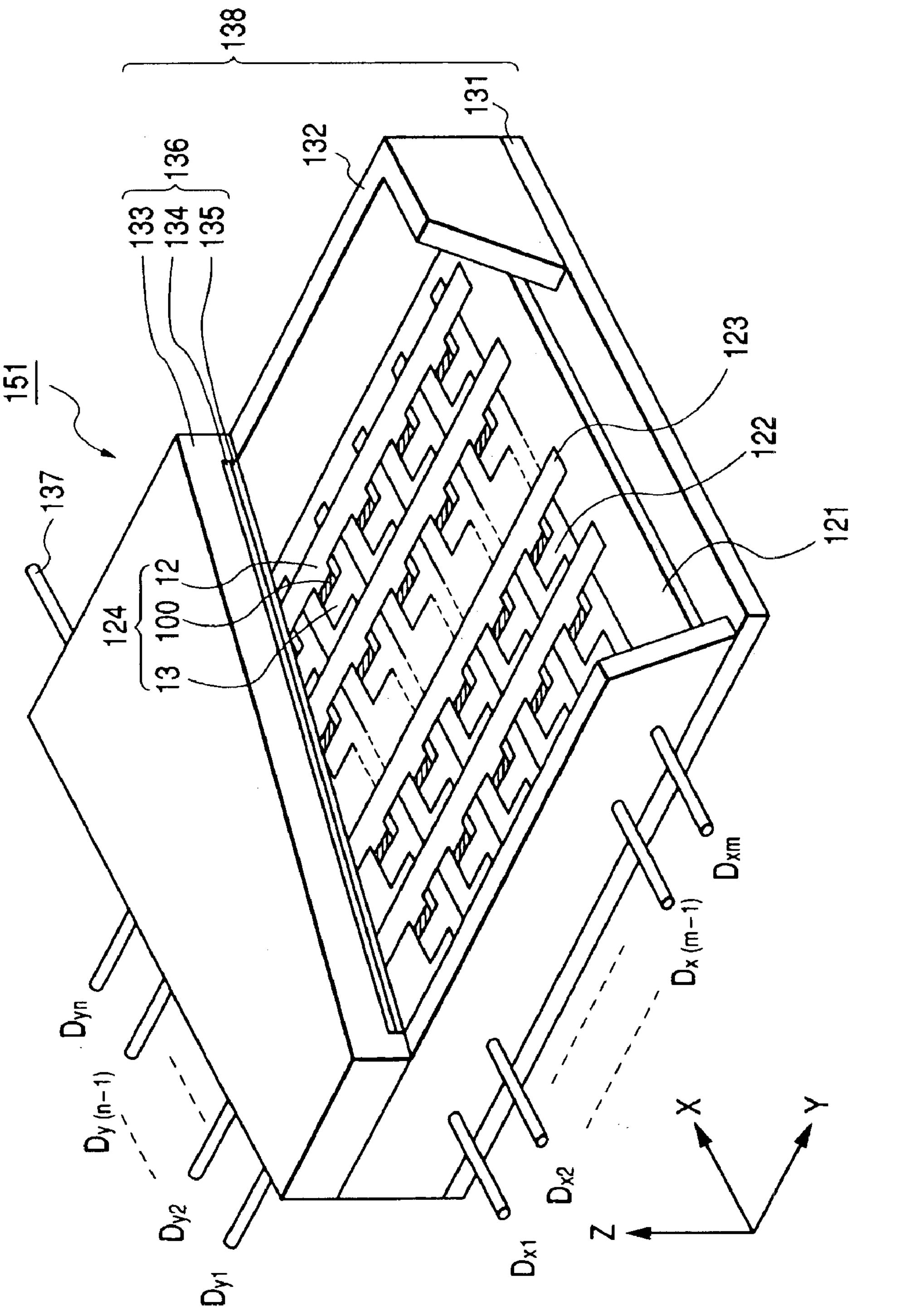
Figure 14A:
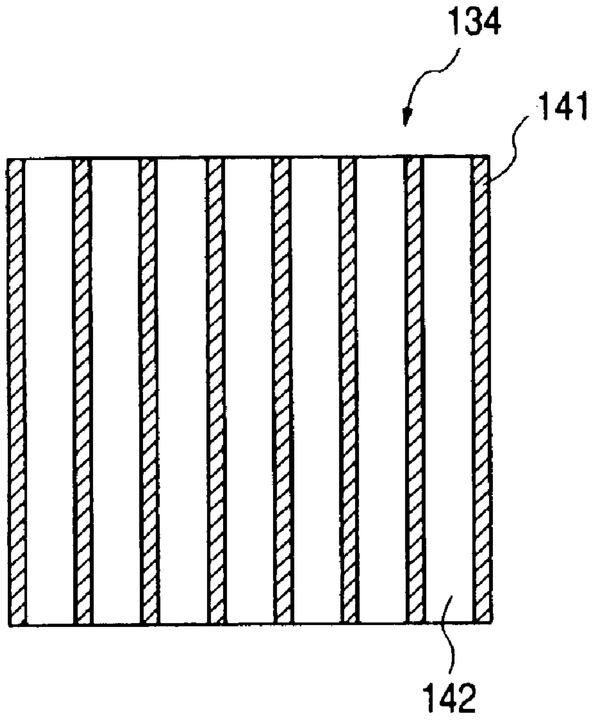
Figure 14B:
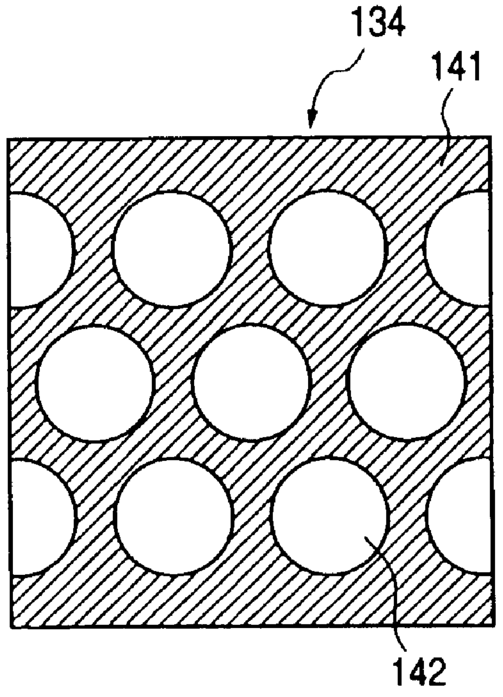
Figure 15:
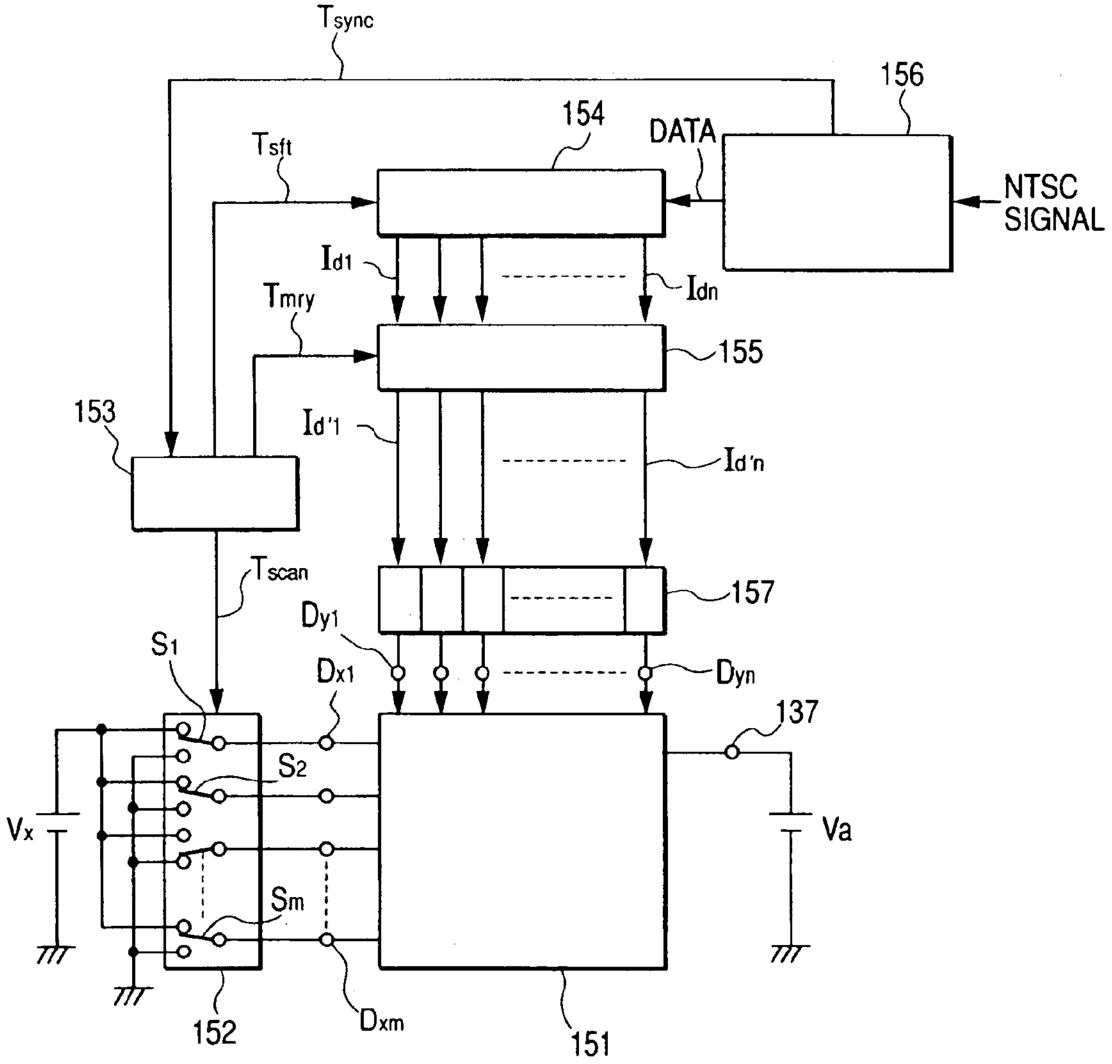
Figure 16:
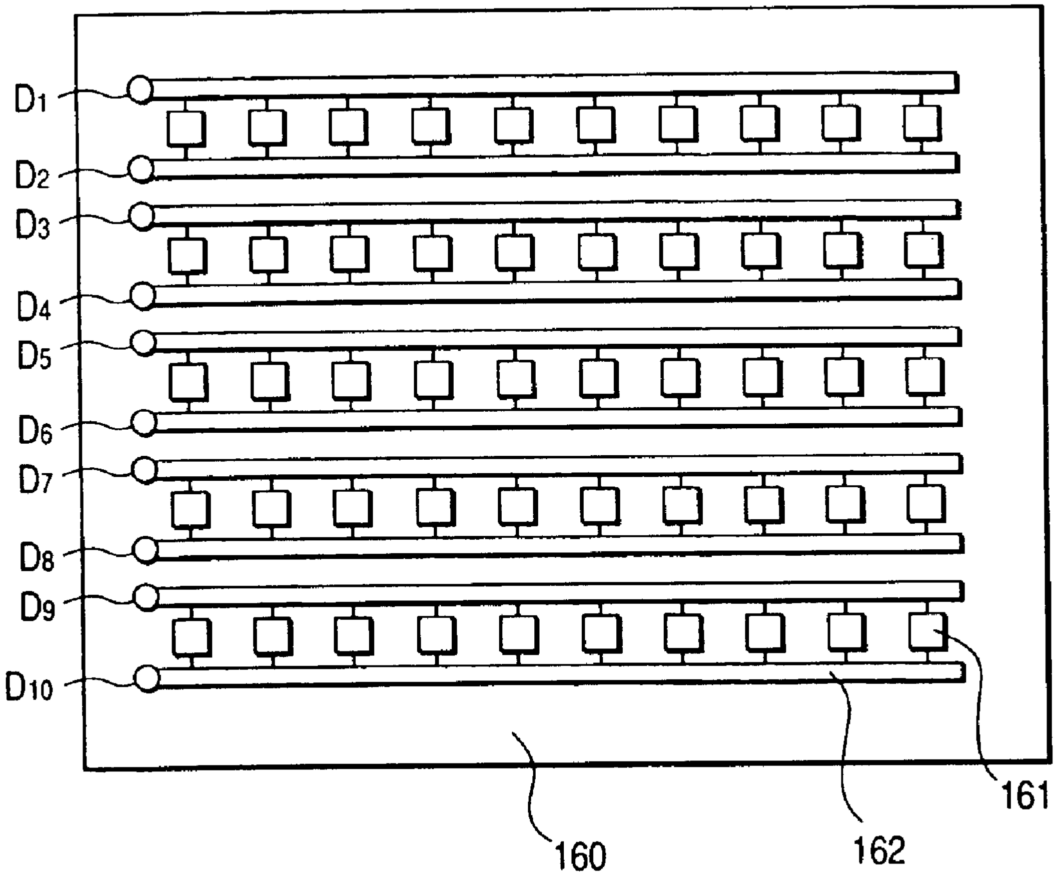
Figure 17:
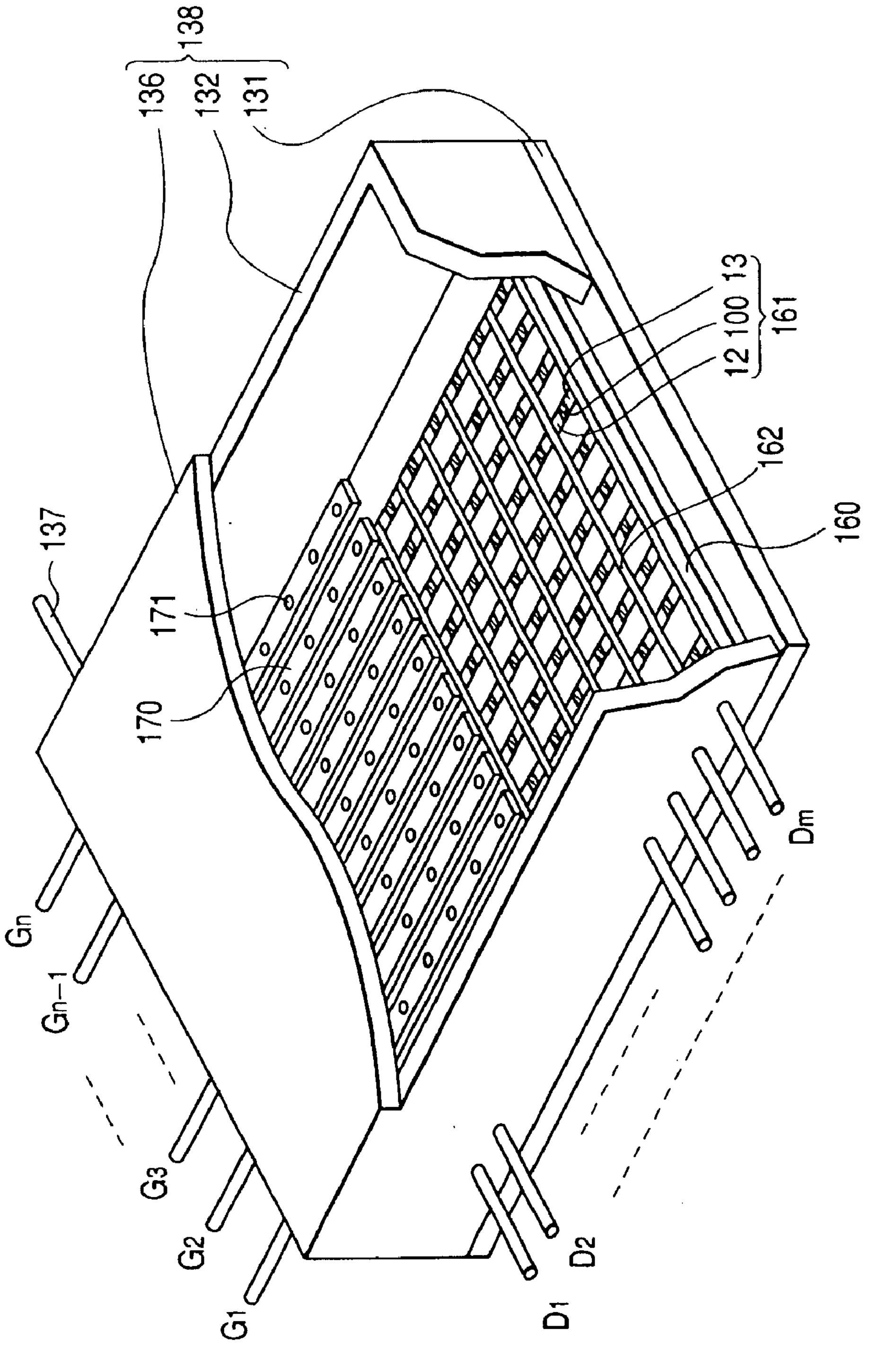
Figure 18:
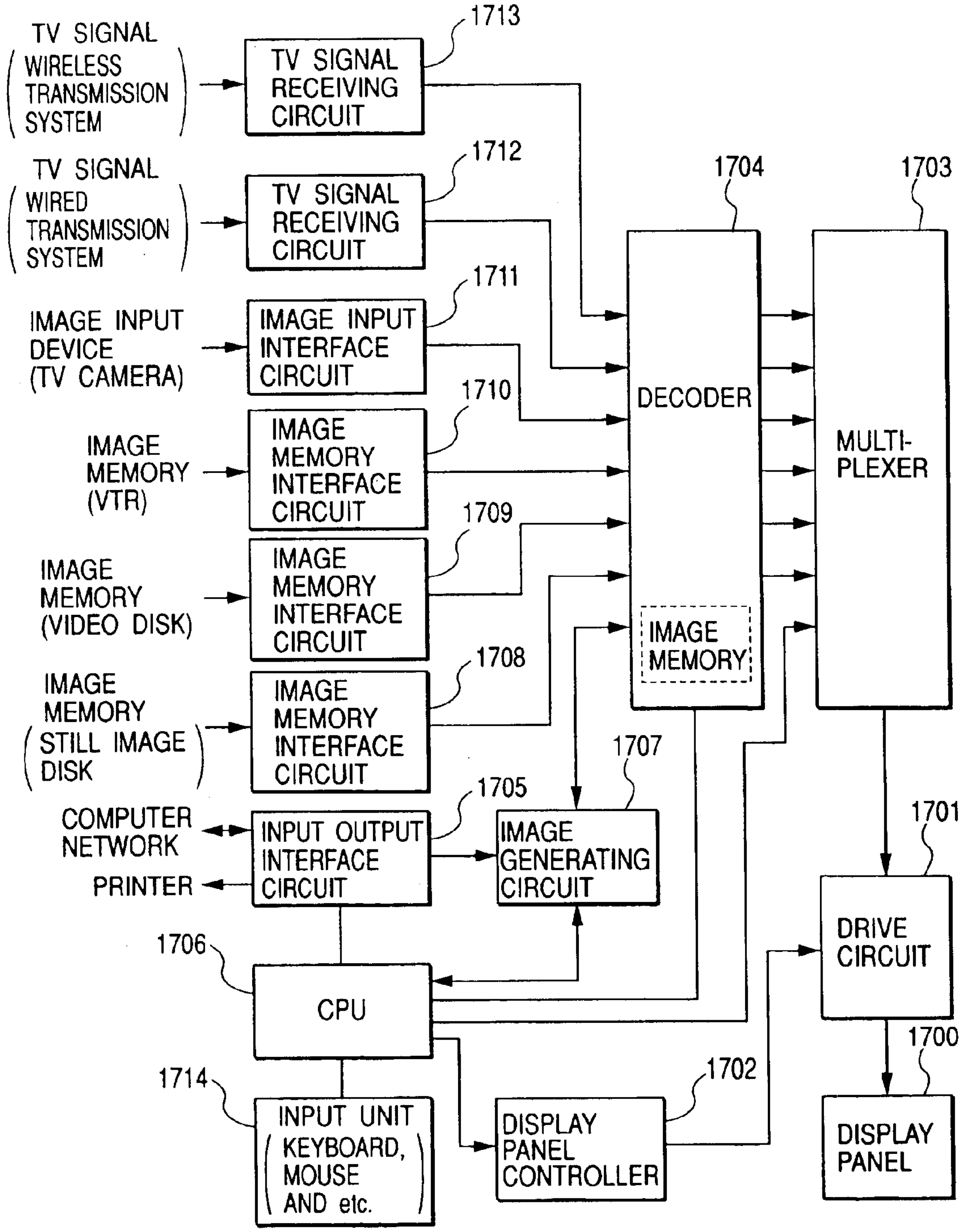
Figure 20:
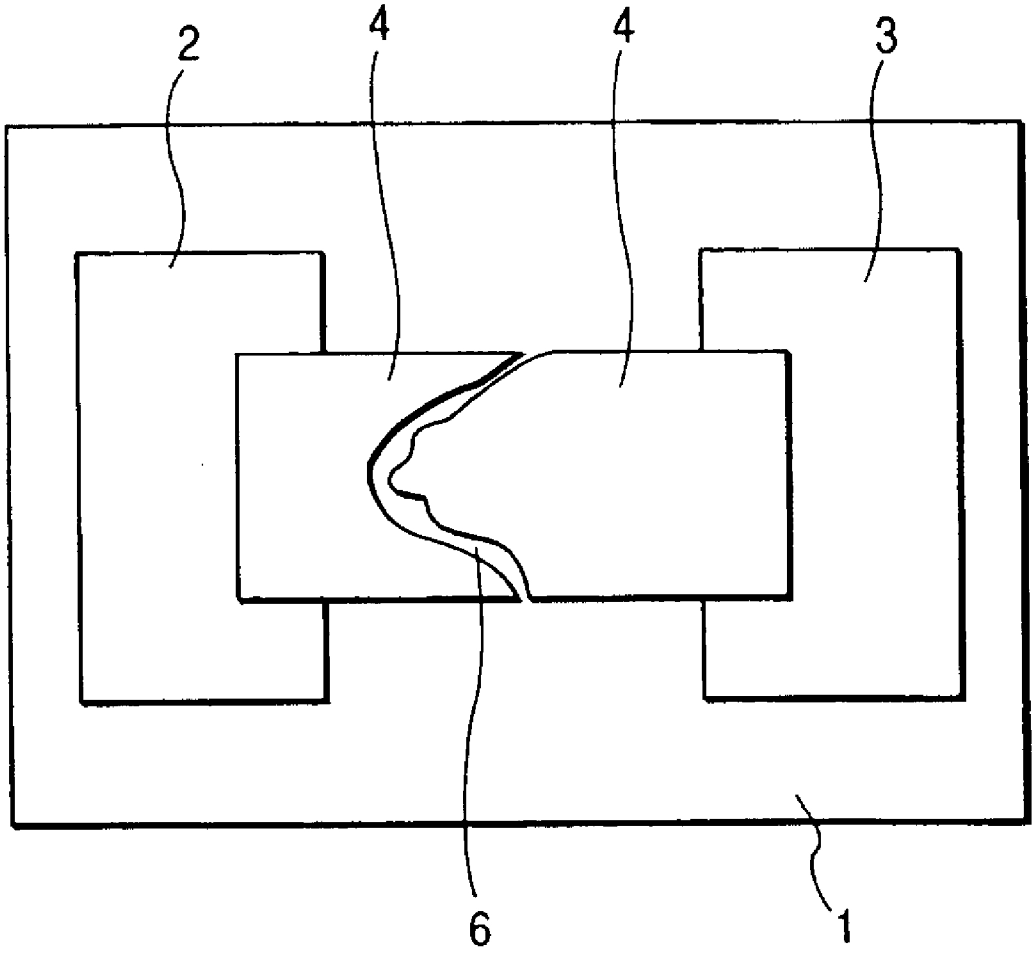
Figure 21A:
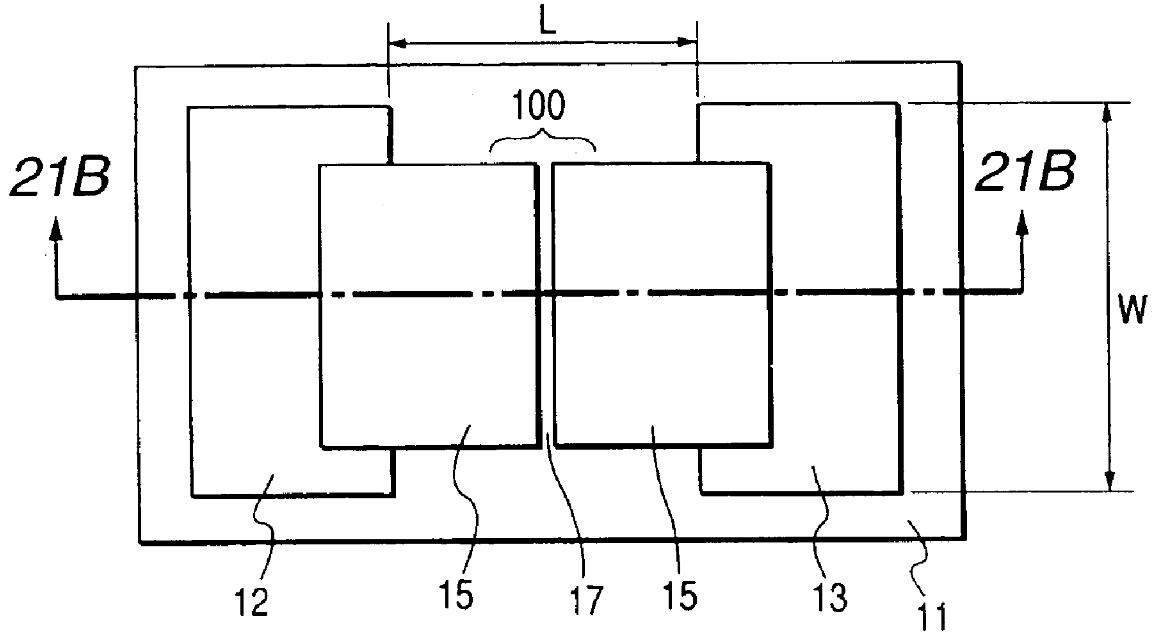
Figure 21B:
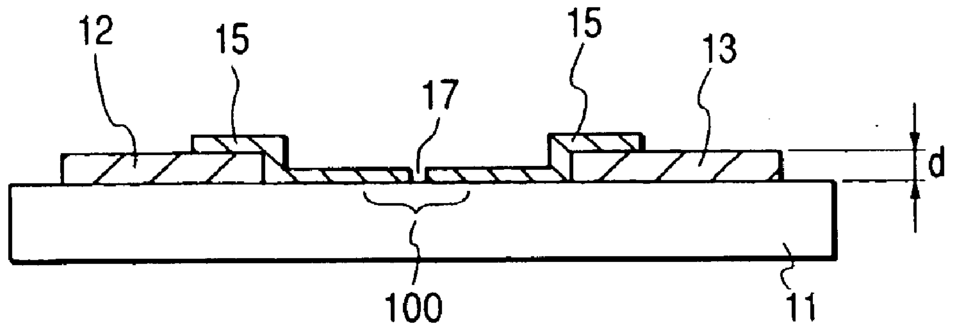
Figure 22A:
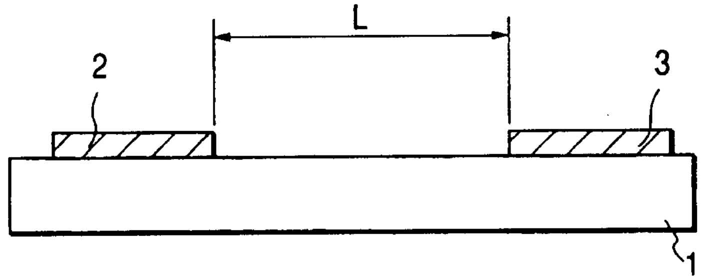
Figure 22B:
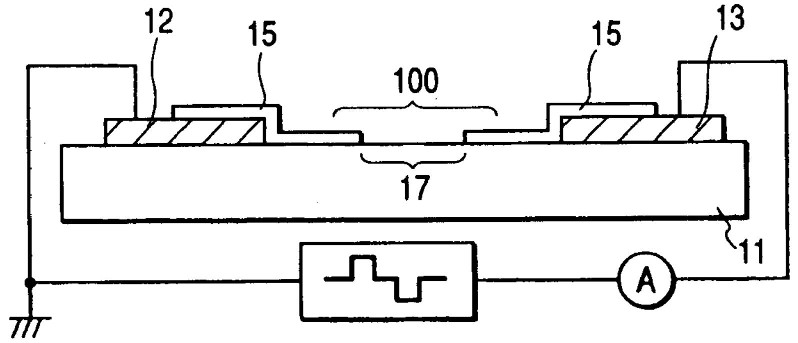
Figure 23:
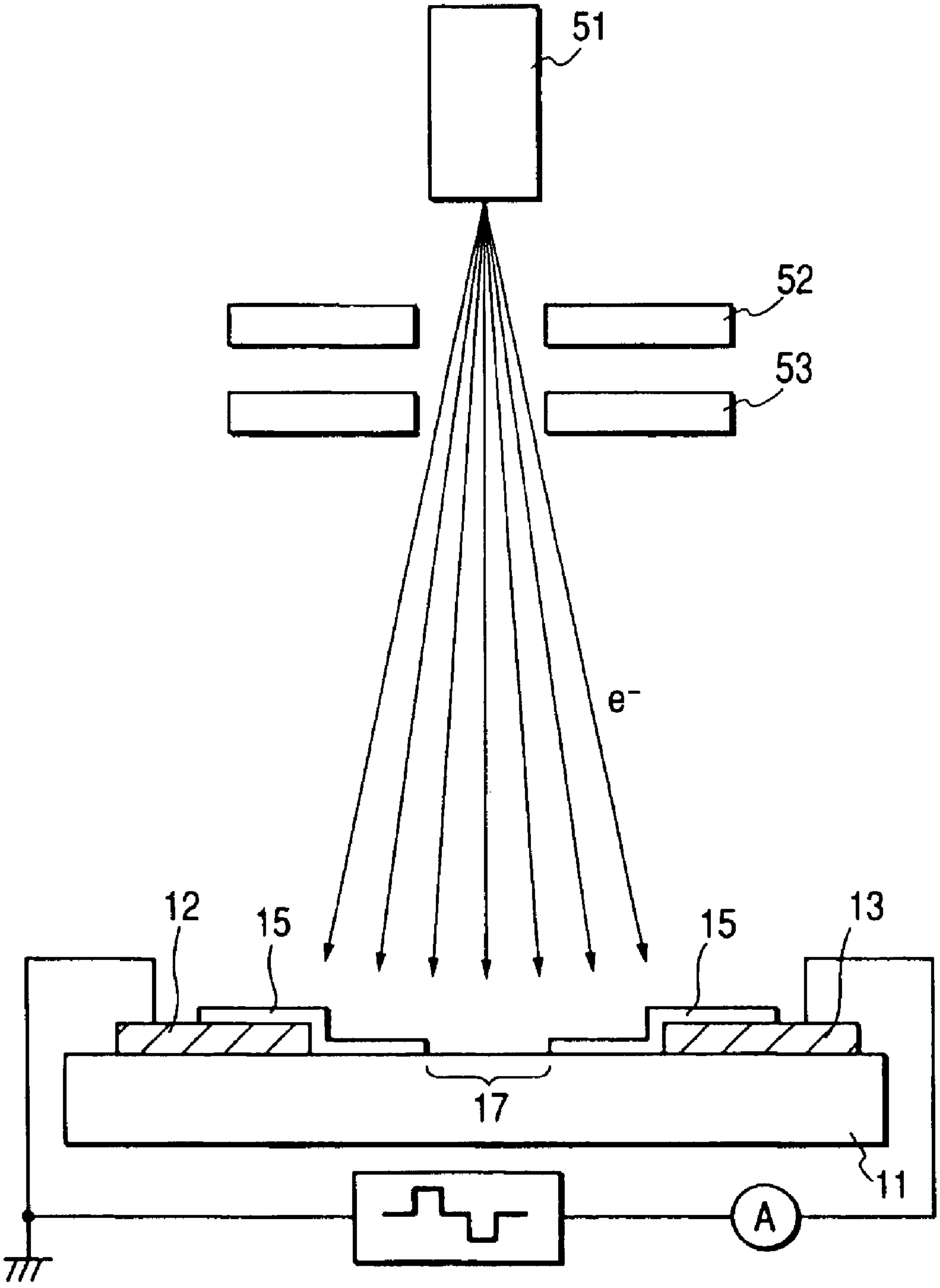
Figure 24A:
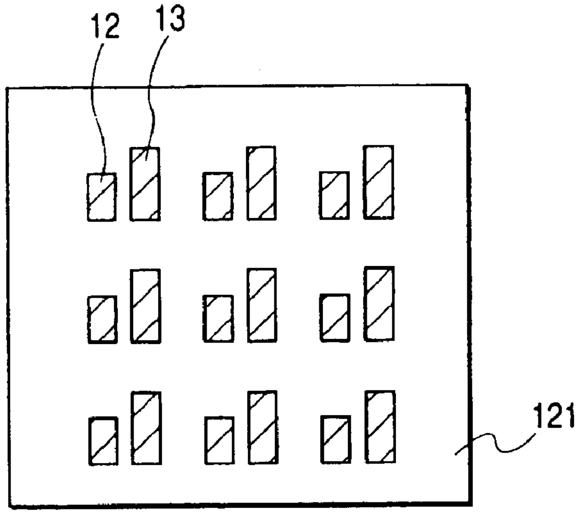
Figure 24B:
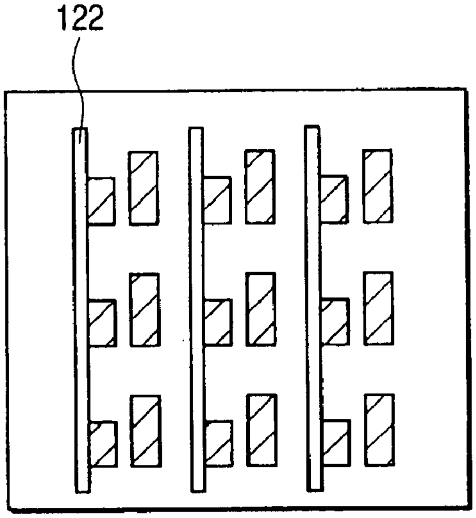
Figure 24C:
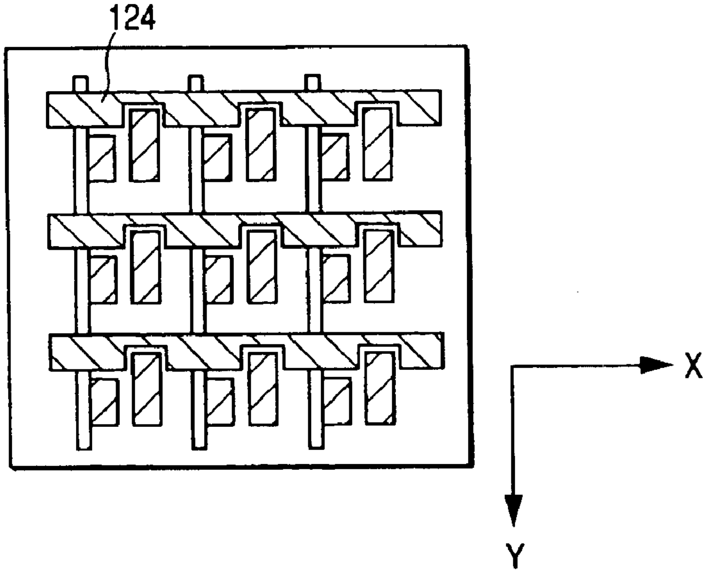
Figure 25D:
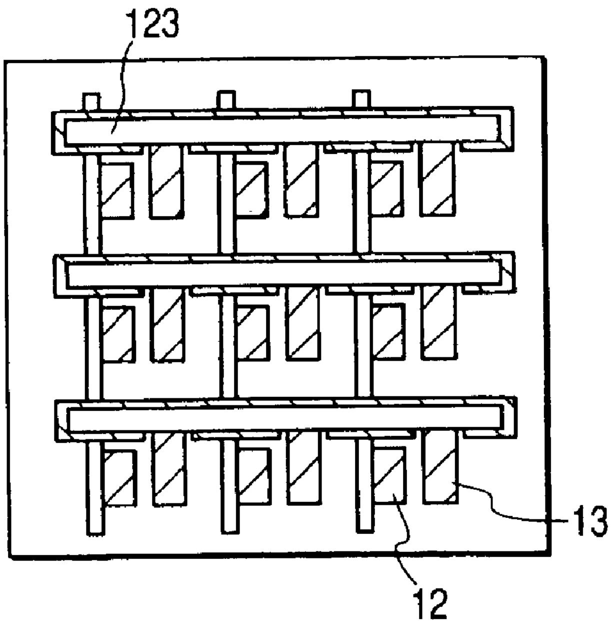
Figure 25E:
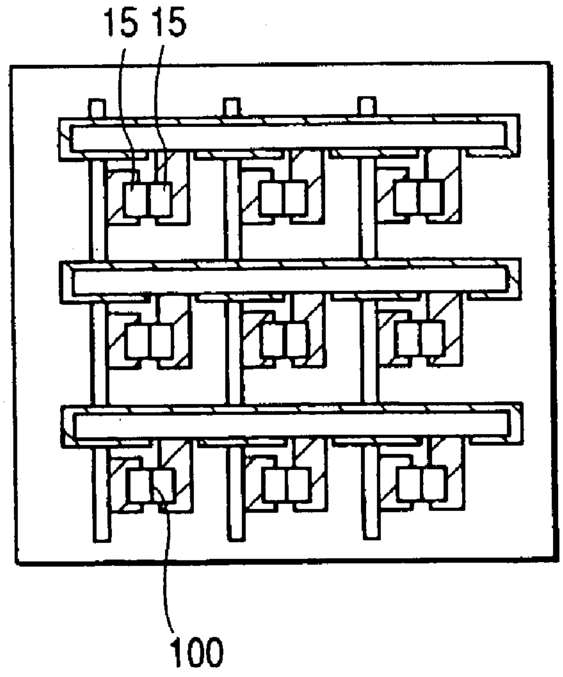
Figure 26D:
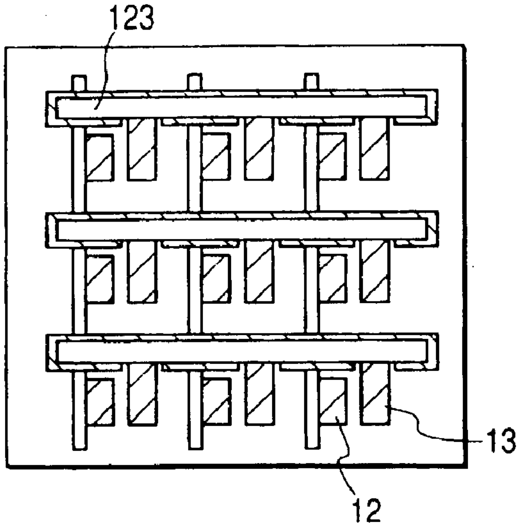
Figure 26E:
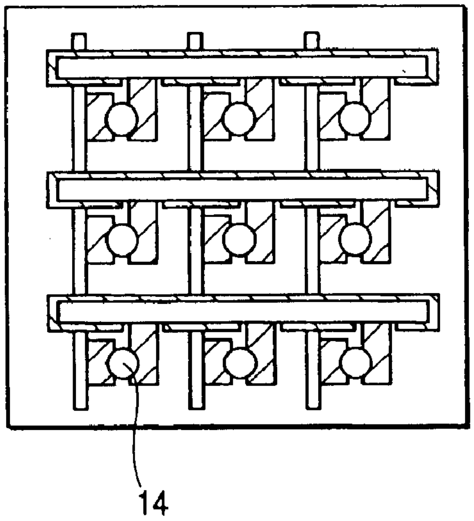
Figure 26F:
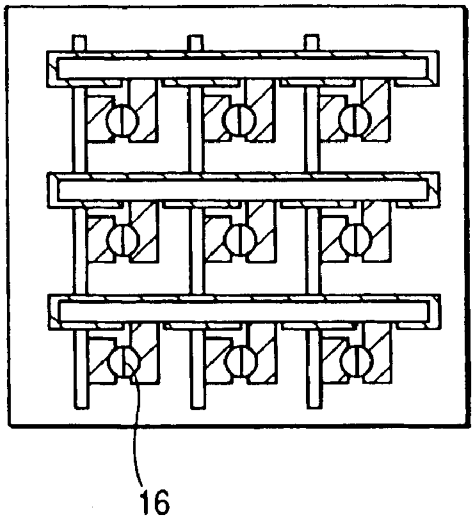

FIG. 5 a schematic diagram showing an evaluating apparatus used to evaluate an electron emitting characteristic of the electron-emitting device according to the present invention;

FIG. 6 is a diagram showing relationship among an emission current Ie, a device current If and a device voltage Vf in the electron-emitting device according to the present invention;

FIGS. 7A and 7B are diagrams showing a configuration of a preferable embodiment for the electron source according to the present invention;

FIGS. 8A and 8B are diagrams showing a voltage waveform for the activation step of the electron source shown in FIGS. 7A and 7B;

FIGS. 9A and 9B are schematic diagrams showing a locus of an electron beam at the activation step of the electron source shown in FIGS. 7A and 7B;

FIGS. 10A and 10B are diagrams showing an another example of voltage waveform used at the activation step of the electron source according to the present invention;

FIG. 11 is a schematic diagram showing a conventional electron-emitting device;

FIG. 12 is a schematic configurational diagram showing an electron source having a simple matrix arrangement preferred as an embodiment of the electron source according to the present invention;

FIG. 13 is a schematic configurational diagram showing a display panel used in an embodiment of the image-forming apparatus according to the present invention which uses an electron source having the simple matrix arrangement;

FIGS. 14A and 14B are diagrams showing fluorescent films on the display panel shown in FIG. 13;

FIG. 15 is a diagram exemplifying a driving circuit for driving the display panel shown in FIG. 13;

FIG. 16 is a schematic diagram showing an electron source having a ladder arrangement preferred as an embodiment of the electron source according to the present invention;

FIG. 17 is a schematic diagram showing a display panel used in an embodiment of the image-forming apparatus according to the present invention which uses the electron source having the ladder arrangement;

FIG. 18 is a block diagram showing an example of the image-forming apparatus according to the present invention;

FIGS. 19A, 19B, 19C and 19D are schematic diagrams showing an example the manufacturing method of the electron-emitting device according to the present invention;

FIG. 20 is a schematic diagram showing a problem to be solved by the present invention;

FIGS. 21A and 21B are schematic diagrams showing an example of the electron-emitting device according to the present invention;

FIGS. 22A and 22B are schematic diagrams showing an example of the manufacturing method of the electron-emitting device according to the present invention;

FIG. 23 is a schematic diagram showing an example of the manufacturing method of the electron-emitting device according to the present invention;

FIGS. 24A, 24B and 24C are schematic diagrams showing an example of the manufacturing method according to the present invention;

FIGS. 25D and 25E are schematic diagrams showing an example of the manufacturing method according to the present invention; and FIGS. 26D, 26E and 26F are schematic diagrams showing an example of the manufacturing method according to the present invention.

DETAILED DESCRIPTION OF THE PREFERRED EMBODIMENTS

In order that an image-forming apparatus which uses electron-emitting devices displays a bright image stably, it is desired to maintain an electron emission characteristic at a higher electron emitting efficiency, more stably and for a longer time.

The electron emitting efficiency means herein a ratio of a current emitted to vacuum (hereinafter referred to as emission current Ie) relative to a current supplied between device electrodes (hereinafter referred to as device current If) when a voltage across a pair of device electrodes of an electron-emitting device which are opposed to each other is applied.

When a high electron emission efficiency can be controlled stably for a long time, it is possible to obtain an image-forming apparatus, for example a flat display which uses a fluorescent material, for example, as an image forming member and forms a bright high quality image with low electric power.

For such application, it is demanded that the emission current Ie is sufficient at a practical voltage level (for example, 10 V to 20 V), that the emission current Ie and the device current If are not varied remarkably during driving, and that the emission current Ie and the device current If are not lowered for a long time.

However, as described above, the conventional manufacturing method of the surface conduction type electron-emitting device poses problems which are explained below.

Characteristics of the device such as an electron emission efficiency and a life of the device are dependent on a structure and stability of a carbon film 10 (see FIG. 19D) comprising of carbon and/or carbon compounds which is deposited at the activation step.

Figure 19A:
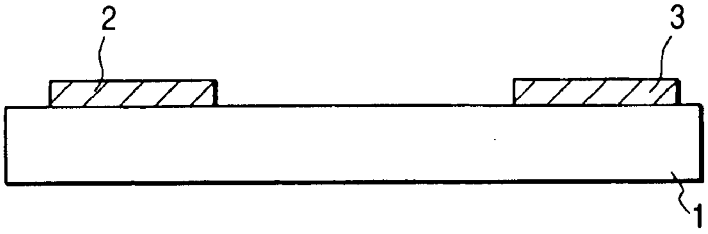
Figure 19B:
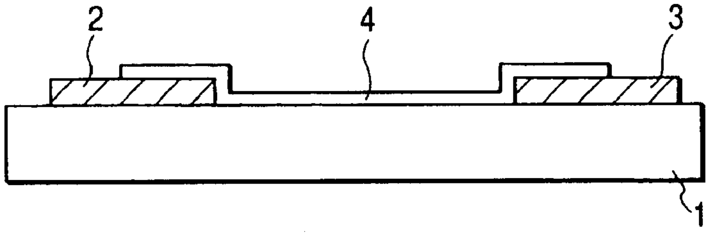
Figure 19C:
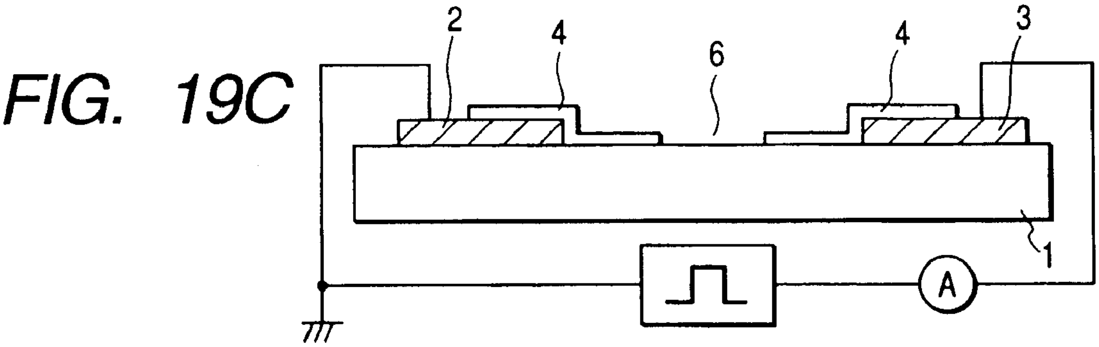
Figure 19D:
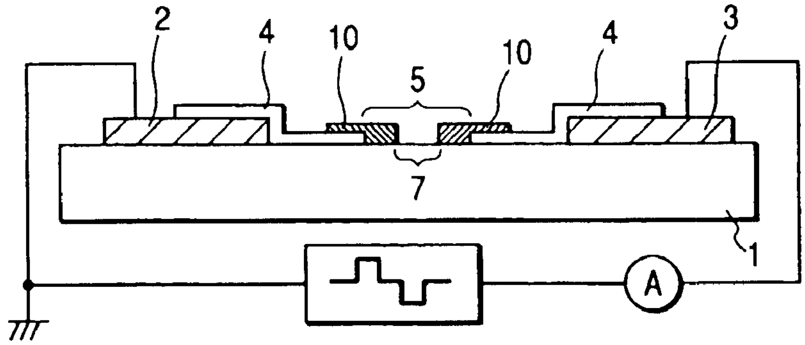

Furthermore, a shape of the second gap 6 which is formed at the forming step described above may have a shape which is ununiform in its width as schematically shown in FIG. 20. FIG. 20 is a schematic plan view of a device which has been subjected to the forming step (FIG. 19C). Furthermore, the second gap 6 which is formed at the forming step may remarkably meander between the electrodes 2 and 3. When the second gap 6 formed at the forming step has an ununiform shape as described above, an ununiform electric field is formed in the gap 6 described above by applying a voltage across the device electrodes 2 and 3.

Even when the second gap 6 has the ununiform shape, it can be covered to substantially narrow its width at the activation step by depositing the carbon film 10 comprising of the carbon and/or the carbon compound on the substrate 1 in the gap 6 and the electrically conductive film 4 in the vicinity of the gap 6.

As a result, by the activation step, variations of the width of the gap 6 formed at the forming step can be reduced, and the emission current Ie and the device current If can be enhanced.

However, ununiformities of distances from the device electrodes 2 and 3 to the gap 6 (meandering of the gap 6) cannot be basically reduced even by carrying out the activation step described above.

Furthermore, a deposited amount of the carbon film 10 which is formed at the activation step may be ununiform dependently on an ununiformity in the width of the gap 6 formed at the forming step.

Due to these ununiformities, an effective voltage applied to the first gap 7 is ununiform when the voltage is applied to the device electrodes 2 and 3. Furthermore, the emission current Ie may be different from location to location or a high electric field is applied locally, thereby producing a region which is easily deteriorated.

Furthermore, the conventional manufacturing method may not provide a required electron emission efficiency makes the emission current Ie variable among devices, and allows the characteristics to be varied or degraded during the driving.

In order to obtain a high-definition image-forming apparatus which is applicable to a flat display using electron-emitting devices, it is therefore necessary to form the electron emitting region of an electron-emitting device, a carbon film comprising of carbon and/or a carbon compound which has a more preferable structure and a more preferable stability.

It is therefore necessary to deposit carbon and/or a carbon compound having preferable structure and stability on the electron emitting region of the electron-emitting device in order to obtain the high-definition image-forming apparatus which is applicable to the flat television or the like using the electron-emitting devices.

In view of the problems described above, the present invention achieves a manufacturing method of an electron-emitting device which exhibits favorable electron emission efficiencies uniformly and stably for a long time, composes manufacturing methods of an electron source and an image-forming apparatus using the manufacturing of the electron-emitting device, and provides an electron-emitting device and an electron source which can exhibit favorable electron emission efficiencies uniformly by the manufacturing method, and provides an image-forming apparatus which uses the electron source and is excellent in a high luminance uniform display characteristic. In view of the problems described above, the present invention achieves a manufacturing method of an electron-emitting device which exhibits favorable electron emission efficiencies for a long time, composes manufacturing methods of an electron source and an image-forming apparatus using the manufacturing of the electron-emitting device, and provides an electron-emitting device and an electron source which have favorable uniform electron emission efficiencies, and a high luminance image-forming apparatus which uses the electron source and is excellent in a display characteristic.

Now, an embodiment of the manufacturing method according to the present invention will be described in detail with reference to FIGS. 1A and 1B, 2A to 2D and 4.

Figure 1A:
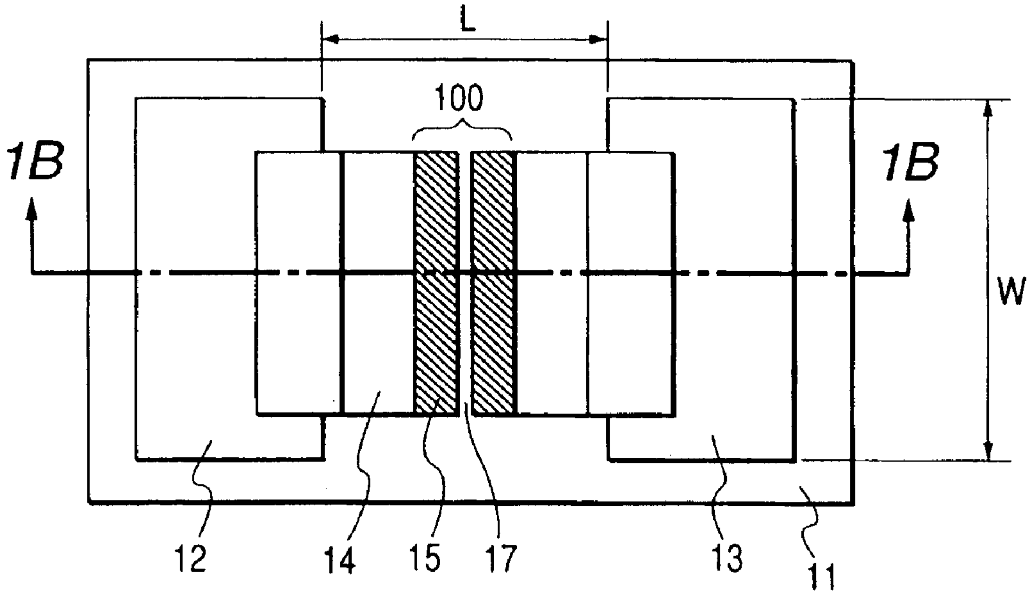
Figure 1B:
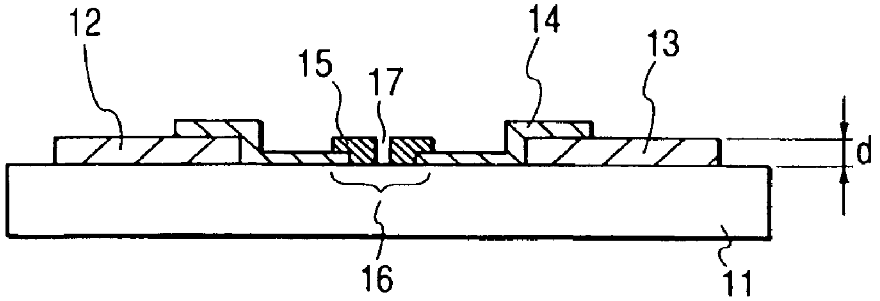

FIGS. 1A and 1B are schematic diagrams showing a configuration of a surface conduction type electron-emitting device to which the present invention is preferably applied: FIG. 1A being a plan view and FIG. 1B being a sectional view taken along a 1B—1B line in FIG. 1A. FIGS. 2A through 2D and 4 are schematic diagrams showing a portion of the manufacturing method according to the present invention.

In FIGS. 1A and 1B, 2A to 2D and 4, reference numeral 11 denotes a substrate, reference numerals 12 and 13 designate device electrodes, reference numeral 14 denotes an electrically conductive film, reference numeral 15 denotes a carbon film (electrically conductive film) having a main component of carbon, reference numeral 100 denotes an electron emitting region, reference numeral 16 designates a second gap and reference numeral 17 denotes a first gap.

(Step A)

Figure 2A:
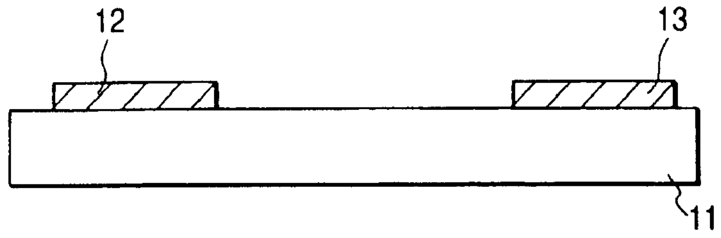

First, the electrodes 12 and 13 which are opposed to each other are to be formed. For this purpose, the substrate 11 is washed sufficiently using a detergent, pure water, an organic solvent and the like, and the electrodes 12 and 13 are formed on the substrate 11 using a photolithography technique after depositing an electrode material by a vacuum deposition method, sputtering process or the like (FIG. 2A). Alternately, the electrodes can be formed by a printing method such as offset printing method. It is preferable to use the printing method, the offset printing method in particular, since it permits inexpensively forming the electrodes so as to have large areas.

Usable as the substrate 11 in the present invention is a glass substrate which is composed of glass having reduced contents of impurities such as Na, silica glass, soda lime glass, soda lime glass coated with $SiO_2$ by the sputtering process, a ceramic substrate or an Si substrate.

A general conductive material is usable as a material of the electrodes 12 and 13. For example, the material is selected adequately out of metals such as Ni, Cr, Au, Mo, W, Pt, Ti, Al, Cu and Pd or alloys thereof, metals and metal oxides such as Pd, Ag, Au, $RuO_2$ and Pd-Ag, printing conductive materials composed of any of the metals, alloys and metal oxides described above and glass or the like, transparent electrically conductive materials such as $In_2O_3$-$SnO_2$ and semiconductor conductive materials such as polysilicon.

A spacing L between the device electrodes, length W of the device electrodes, a shape of the electrically conductive film 14 and the like are designed taking an application mode or the like into consideration. The spacing L between the device electrodes is preferably within a range from hundreds of nanometers to hundreds of micrometers, more preferably within a range from several micrometers to scores of micrometers taking into consideration a voltage or the like to be applied across the device electrodes.

Taking a resistance value of the electrodes and electron emission efficiencies into consideration, the length W of the device electrodes is preferably within a range from several micrometers to hundreds of micrometers and film thickness d of the device electrodes 12 and 13 is preferably within a range from scores of namometers to several micrometers.

The electron-emitting device can have the configuration shown in FIGS. 1A and 1B but also a configuration wherein the electrically conductive film 14 and the device electrodes 12 and 13 which are opposed to each other are laminated in this order on the substrate 11.

(Step B)

Figure 2B:
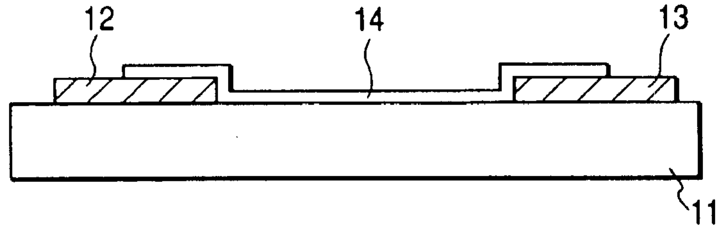

Then, the electrically conductive film 14 is to be formed. By applying an organometal solution, for example, an organic metal film is formed on the substrate 11 on which the electrodes 12 and 13 are disposed. The organometal solution is a solution of an organometallic compound which has a main component of the metal selected as the material of the electrically conductive film 14 described above. The organometal film is baked and patterned by lifting off or etching, thereby forming the electrically conductive film 14 (FIG. 2B). Though the organic metal film is formed by applying the organometal solution in the above description, this application method is not limitative and the vacuum deposition method, the sputtering process, a chemical vapor deposition method, a dispersion coating method, a dipping method, a spinner method, an ink-jet method or the like may be used to form the electrically conductive film 14.

An ink-jet method is preferable from a viewpoint of productivity since it permits imparting minute liquid drops of 10 nanograms to scores of nanograms to the substrate with high repeatability and makes it unnecessary to pattern the electrically conductive film by the photolithography or a vacuum process. To form the electrically conductive film by the ink-jet method, it is possible to use a bubble jet type apparatus which uses an electrothermal energy conversion element as an energy generating element or a piezo-jet type apparatus which uses a piezoelectric element. Used as calcining (baking) means for the liquid drops described above is electromagnetic wave irradiating means, heated air blowing means or means to heat the substrate as a whole. Usable as the electromagnetic wave irradiating means is, for example, an infrared lamp, argon ion laser or a semiconductor laser or the like.

A material for the electrically conductive film 14 can be selected from among metals such as Pd, Pt, Ru, Ag, Au, Ti, In, Cu, Cr, Fe, Zn, Sn, Ta, W and Pd, oxides such as PdO, $SnO_2$, $In_2O_3$, PbO and $Sb_2O_3$, borides such as $HfB_2$, $ZrB_2$, $LaB_6$, $CeB_6$, $YB_4$ and $GdB_4$, carbides such as TiC, ZrC, HfC, Ta, C, SiC and WC, nitrides such as TiN, ZrN and HfN, and semiconductors such as Si or Ge.

Film thickness of the electrically conductive film 14 is set adequately taking into consideration a step coverage to the device electrodes 12 and 13, resistance value between the device electrodes 12 and 13, etc. and the thickness is preferably within a range from several angstroms to hundreds of nanometers, or more preferably within a range from 1 nm to 50 nm. A resistance value Rs of the electrically conductive film is preferably within a range from $1\times10^2$ to $1\times10^7$ Ω/□. For calculation of Rs, resistance R of a thin film which has a width w and a length l measured in a longitudinal direction is taken as R=Rs (l/w).

(Step C)

Figure 2C:
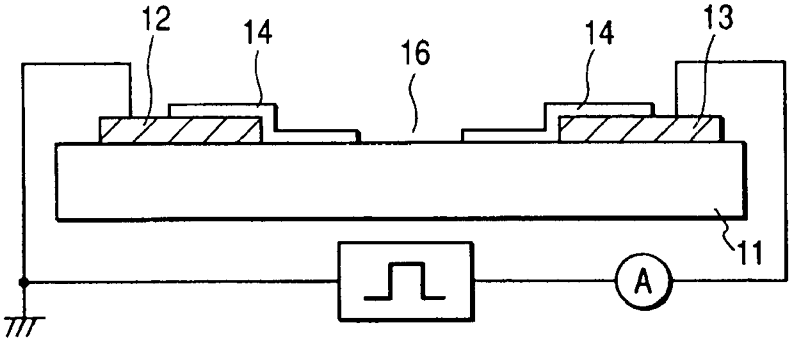

Then, the forming step is carried out to form the second gap 16 in the electrically conductive film (electrically conductive member) 14. Speaking concretely, a voltage is applied to a pair of the electrodes 12 and 13 to flowing a current through the electrically conductive film 14, thereby forming the gap 16 which has a local structural variation such as breakage, deformation or degeneration in a portion of the electrically conductive film 14 (FIG. 2C). Though the electrically conductive film 14 is completely separated into right and left sections in FIG. 2C, these sections may be partially connected to each other. Therefore, the electrically conductive film 14 in which the gap 16 has been formed at the forming step described above may be a pair of electrically conductive films (electrically conductive members) opposed to each other with the gap 16 interposed or the electrically conductive film (electrically conductive member) 14 which has the gap 16.

Figure 3:
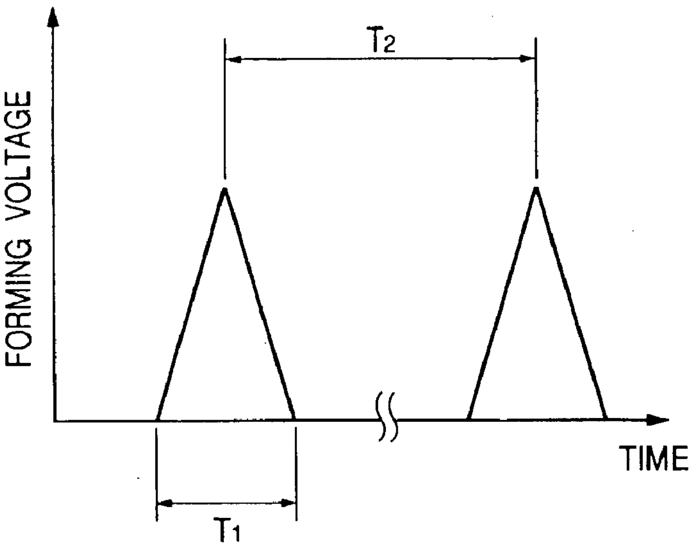
FIG. 3 is a diagram showing a voltage waveform used to form an electron emitting region of the electron-emitting device according to the present invention.

FIG. 3 shows an example of voltage waveform for an energization treatment described above. In FIG. 3, a pulse width T1 is set freely within a range from 1 μsec to 10 m sec and a pulse interval T2 is set freely within a range from 10 μsec to 10 msec. A pulse hight is selected dependently on a material and thickness of the electrically conductive film. Under conditions which are described above, a pulse voltage is applied for several seconds to scores of minutes. When a current value during voltage application is preliminarily measured, a current value not exceeding a certain set value is usable to judge that formation of the gap 16 has been completed. For example, a resistance value is determined by measuring a current which is supplied by applying a voltage on the order of 0.1 V and when the resistance is larger than 1 MΩ, the formation is terminated by stopping the current. (Step D)

The activation step is carried out to form the carbon film 15 having the main component of carbon is formed on the electrically conductive film 14 in which the second gap 17 has been formed as described above (FIG. 2D). The device current If and the emission current Ie can be remarkably enhanced at this step.

Figure 4:
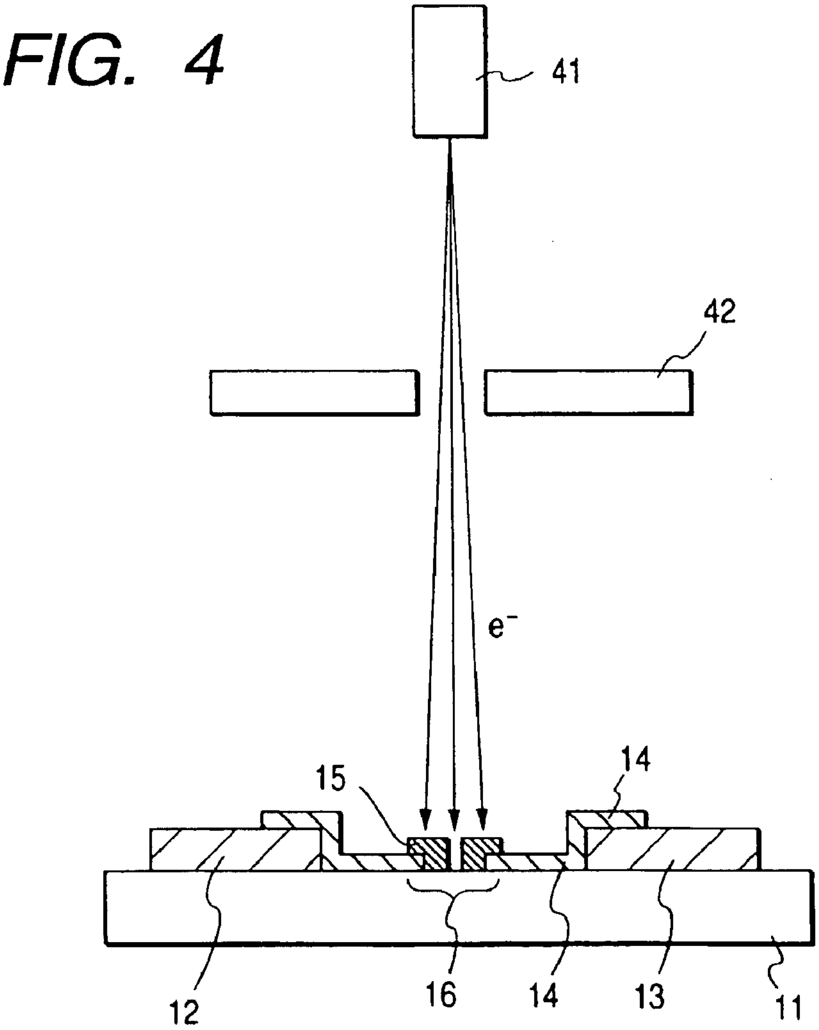
FIG. 4 is a schematic diagram showing electron irradiating means which is used at an activation step of the manufacturing method of the electron-emitting device according to the present invention.

According to the present invention, electron emitting means 41 is separately disposed outside the electron-emitting device as shown in FIG. 4 at the activation step and the carbon film 15 having the main component of carbon is formed by applying a voltage across the electrodes 12 and 13 while irradiating any one of areas (1) through (3) mentioned below in the vicinity of the gap 16 with an electron beam emitted from the electron emitting means. That is, voltage application to the electrodes 12 and 13 is carried out simultaneously with irradiation with the electron beam from the electron emitting means.

The area irradiated with the electron beam described above is:

(1) The substrate 11 in the gap 16 described above (2) The substrate 11 in the gap 16 described above and the electrically conductive film 14 in the vicinity of the gap 16 or (3) The substrate 11 in the gap 16 described above, the electrically conductive film 14, and additionally the electrodes 12 and 13. It is preferable to irradiate the region (3) described above with the electron beam.

Figure 2D:
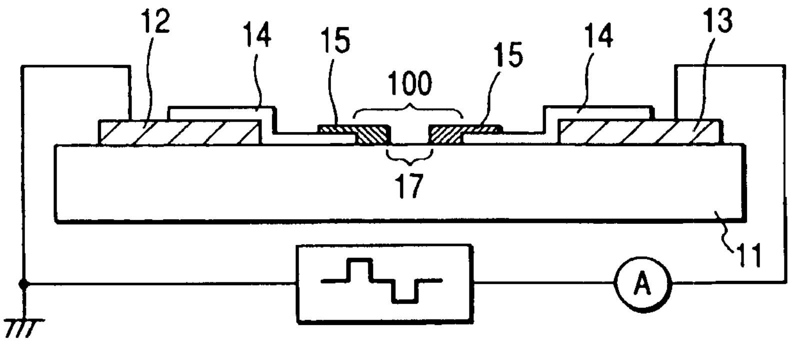

Furthermore, it is preferable at the activation step described above of carrying out the voltage application to the electrodes 12 and 13 by repeatedly applying a pulse voltage. Moreover, it is preferable for the present invention to apply a bipolar pulse voltage as shown in FIG. 2D or FIG. 22B.

The carbon film 15 can be formed by repeatedly applying a pulse voltage across the electrically conductive film 14 (the pair of electrodes 12 and 13) in an atmosphere containing a carbon compound gas (an organic substance gas) and irradiating the vicinity of the gap 16 with the electron beam emitted from the electron emitting means 41 disposed apart from the electron-emitting device.

FIG. 4 schematically shows an apparatus used to irradiate the vicinity of the gap 16 with an external electron beam. In FIG. 4, reference numeral 41 denotes electron emitting means. The electron-emitting device and the electron emitting means 41 are disposed in the same vacuum vessel. Usable as the electron emitting means 41 is a structure which uses a thermionic cathode as an electron beam source and accelerates an electron beam by applying an accelerating voltage.

It is not necessary to focus the electron beam emitted from the electron emitting means 41 only on the gap 16, but it is preferable to spread the electron beam to an extent not smaller than several micrometers around the gap 16 taking into consideration the voltage applied across the electrodes (12, 13) and a partial pressure of the carbon compound gas at the activation step.

When too large a region is irradiated with the electron beam, however, the carbon compound may be deposited on an unnecessary area. It is therefore preferable to shield the electron beam emitted from the electron emitting means 41 with electron beam shielding means 42 to suppress spreading of the electron beam.

It is preferable to set the accelerating voltage described above set to 1 kV to 20 kV. In other words, it is preferable to irradiate the region with an electron beam which has an energy not lower than 1 keV and not higher than 20 keV. The electron beam may be emitted like a DC voltage or as pulses in synchronization with the pulse voltage applied across the electrodes 12 and 13 described above. It is preferable to apply the pulse voltage to the device electrodes described above while emitting the electron beam continuously (like the DC voltage).

At the activation step of the present invention, it is preferable to apply a voltage to the device electrodes 12 and 13 while irradiating with the electron beam emitted from the electron emitting means 41. In other words, any one of the regions (1) through (3) described above is irradiated with the electron beam emitted from the electron emitting means while the voltage is being applied to the device electrodes 12 and 13.

The carbon films 15 described above which are formed at the activation step of the present invention is connected to the electrodes 12 and 13 described above respectively by way of the electrically conductive film 14 or directly.

Furthermore, the electrically conductive films (carbon films) 15 which are formed at the activation step described above are opposed to each other with the first gap 17 interposed as shown in FIG. 2D. Though the carbon films 15 are completely separated into right and left sections taking the first gap 17 as a border in FIG. 2D, these films may be partially connected to each other. Accordingly, the carbon films 15 formed in the activation step may be a pair of carbon films (electrically conductive members) 15 opposed to each other with the gap 17 interposed or a carbon film (electrically conductive member) 15 which has the gap 17.

As the carbon compound (organic substance) to be contained in the atmosphere at the activation step described above, there can be mentioned aliphatic hydrocarbons such as alkane, alkene and alkyne, aromatic hydrocarbons, alcohols, aldehydes, ketones, amines, and organic acids such as phenol, carboxylic acid and sulfonic acid: concretely, usable carbon compounds are saturated hydrocarbons such as methane, ethane and propane which are expressed by $CnH_{2n+2}$, unsaturated hydrocarbons such as ethylene and propylene which are expressed by a constitutional formula of $CnH_{2n}$, benzene, toluene, methanol, ethanol, formaldehyde, acetradehyde, acetone, methyl ethyl ketone, methyalmine, ethylamine, phenol, formic acid, acetic acid, propionic acid or mixtures thereof.

It is considered that at the conventional activation step described above, the carbon compound (organic substance) existing in the atmosphere is decomposed only by a current supplied through the second gap 16, the carbon and/or carbon compound is deposited onto the substrate within the second gap 16 and the electrically conductive film 14 in the vicinity of the gap 16, and electrons emitted from the vicinity of the gap 16 (the gap 17 which is being formed) irradiate the carbon or carbon compound and crystallize a portion of the carbon or carbon compound, thereby imparting electrical conductivity.

A crystalline structure of the carbon film 15 obtained in the activation step contains a graphite structure and/or an amorphous structure. Furthermore, the carbon film 15 may have such an intermediate structure in the course of its formation. The carbon film 15 can have a high electrical conductivity when it has the graphite structure, but its electrical conductivity is lowered when the film has the amorphous structure. A degree of crystallinity produces a strong influence on characteristics of the electron-emitting device, an electron emission efficiency in particular which is described later.

The degree of crystallinity denotes a proceeding degree of a substance to change from an amorphous condition via a condition where a periodic structure is disordered relatively remarkably to a complete crystal structure.

Furthermore, the conventional activation step tends to allow the carbon or carbon compound deposited in the gap 16 to be deposited, in particular, into relatively narrow gaps in the gap 16 as the step proceeds. As a result, the carbon film 15 is formed in a "disordered" structure.

Accordingly, the conventional manufacturing method produces "disordered" structure of the carbon film 15 as the activation step proceeds, whereby some locations of the deposited carbon or carbon compound are not irradiated sufficiently with the electrons emitted from the vicinity of the gap 16. In such a condition, a film of the carbon or carbon compound deposited in the vicinity of the gap 16 grows in a condition where it contains a number of regions having low degrees of crystallinity, whereby the carbon film 15 thus obtained has a low electrical conductivity. It is considered that the low electrical conductivity is a result caused by insufficient irradiation with the electron beam in the growing step of carbon film 15.

When the carbon film contains the number of regions having low degrees of crystallinity as described above, it is considered that a crystalline structure of the carbon film 15 is gradually changed by bombardment with the electrons emitted from the electron emitting region or due to heat generation caused by the device current If, thereby changing a degree of crystallinity from the amorphous structure to the graphite structure. Furthermore, it is considered that resistance of the carbon film 15 is changed simultaneously, thereby gradually changing an electrical conduction characteristic of the device.

Change of the electrical conduction characteristic results in variations of electron-emitting characteristics of devices, thereby allowing luminance to be variable in case of an image-forming apparatus for which a number of devices desirably have uniform characteristics.

In contrast, the manufacturing method of electron-emitting device according to the present invention which uses an electron beam from outside the device is capable of irradiating the carbon film being formed in the second gap 16 sufficiently with the electron beam. Accordingly, the manufacturing method according to the present invention is capable of accelerating a change of a physical property of the carbon film, thereby efficiently forming an electrically conductive film composed mainly of a carbon film which has a sufficiently high degree of crystallinity and a high electrical conductivity. As a result, the manufacturing method according to the present invention is capable of restraining the deterioration of the physical property of the carbon film during the driving as described above. Accordingly, the manufacturing method according to the present invention stabilizes the electron emitting characteristic of the device.

The manufacturing method according to the present invention is capable of controlling specific resistance of the electrically conductive film (carbon film) having the main component of carbon to 0.001 Ωm or lower.

Furthermore, the manufacturing method of an electron source according to the present invention permits using an electron beam emitted from an electron emitting region of an adjacent electron-emitting device as the electron beam to irradiate the electron emitting region. This technique makes it unnecessary to dispose separate electron emitting means for electron beam irradiation as shown in FIG. 4.

Though the carbon film 15 may be formed partially thick and shadowed regions which can hardly be irradiated with electron may be produced when a reaction to form the carbon film is made ununiform by the "disordered" structure, the manufacturing method according to the present invention makes it possible to irradiate the carbon film at different angles by disposing external electron emitting means as described above and receiving electrons from the other adjacent device.

Description will be made below of a technique to use an electron beam emitted from a different electron-emitting device.

Description will be made taking an example wherein two devices are disposed adjacent to each other so that the devices use a device electrode commonly.

When the two electron-emitting devices are adjacent to each other, it is possible to irradiate a vicinity of an electron emitting region of an electron-emitting device with an electron beam emitted from an electron emitting region of the other electron-emitting device, thereby forming a carbon film (electrically conductive film) having a main component of carbon while irradiating the electron emitting region with the electron beam. Since electrons are emitted from a side of a cathode toward a side of an anode at this time, electrons can be led to the electron emitting regions of the electron-emitting devices with a higher efficiency by matching directions of electrons emitted from the two electron-emitting devices with each other. Owing to a structure wherein the one of the device electrodes is used commonly by the two electron-emitting devices adjacent to each other or either device electrode of the electron-emitting device is electrically connected to either electrode of the other electron-emitting device in particular, the embodiment allows each of the electron-emitting devices to irradiate the electron emitting region of the other electron-emitting device. In other words, it is possible to completely match electron emitting directions with each other and irradiate the vicinity of an electron emitting region with an electron beam emitted from another electron emitting region by setting a device electrode commonly used or device electrodes connected to each other at a ground potential and applying AC voltages which are deviated in phases from each other in phases, for example voltages deviated $\pi$ in phases, to a pair of electrodes. As a result, it is possible to efficiently form electrically conductive films (carbon films) having a main component of carbon on two electron emitting regions substantially at the same time.

FIGS. 7A and 7B are schematic diagrams showing a configuration of an electron source used for the embodiment: FIG. 7A being a plan view and FIG. 7B being a sectional view. In FIGS., 7A and 7B, reference numeral 71 denotes a substrate on which a common device electrode 72, and device electrodes 73 and 74 are formed. An electrically conductive film 75, an electron emitting region 79 and a carbon film 76 are formed between a pair of device electrodes (referred to as an electrode pair A) consisting of the common device electrode 72 and the device electrode 73 to compose an electron-emitting device A. Furthermore, an electrically conductive film 77, an electron emitting region 80 and a carbon film 78 are formed between a pair of electrodes (referred to as a device electrode pair B) consisting of the common device electrode 72 and the device electrode 74 to compose an electron-emitting device B.

It can be regarded that the electron source has a basic configuration wherein a device is composed by arranging two electron-emitting devices similar to that described with reference to FIGS. 1A and 1B in series by way of the common device electrode 72.

The electrodes 72 through 74 and the electrically conductive films 75 and 77 of the electron-emitting devices described above are formed by a method which is similar to that to form the electron-emitting device described above. Furthermore, a spacing L1 between the electrodes, and a length W and a film thickness of the electrodes are determined taking electron emission efficiencies into consideration. In FIGS. 7A and 7B, the two electrode pairs have the same spacing L1 and the three electrodes have the same length. Furthermore, a width L2 of the common device electrode 72 is set taking into consideration a distance at which the electron beam emitted from the electron emitting region can each the adjacent electron emitting region. An overlapping width of the device electrode over the electrically conductive film is optional so far as electrical conduction establishes between these members.

The electron emitting regions 79 and 80 can be simultaneously formed by grounding the common device electrode 72, connecting the device electrode 73 to the device electrode 74 to set these electrodes at an equal potential and applying a voltage simultaneously to the electrode pairs A and B.

For the activation treatment of two electron-emitting devices which are adjacent to each other as shown in FIGS. 7A and 7B, the device can be irradiated with an electron beam emitted from the other device. Concrete procedures for the irradiation will be described below.

The common device electrode 72 is grounded, and a pulse voltage source (not shown) is connected to the device electrodes 73 and 74.

FIGS. 8A and 8B exemplify voltage waveforms a and b of rectangular pulses to be applied like AC voltages to the device electrode 73 and the device electrode 74 respectively. As seen from FIGS. 8A and 8B, pulse voltage which are different n in phases are applied to the electrodes respectively.

Now, electrons flow through the electron emitting region in a direction from an electrode at relatively low potential toward an electrode at a high potential and a part of the electrons are emitted in the same direction as an electron beam. When voltages such as those shown in FIGS. 8A and 8B are applied, electron beams are therefore emitted alternately in a direction from the electron emitting region 79 toward the electron emitting region 80 and a direction from the electron emitting region 80 toward the electron emitting region 79.

FIGS. 9A and 9B schematically show a manner of alternate emission of electron beams. Each time a polarity of a pulse voltage changes, a direction of an electron beam is changed as shown in FIGS. 9A and 9B. In case of FIG. 9A, an electron beam emitted from the electron emitting region 79 irradiates a vicinity of the electron emitting region 80. In case of FIG. 9B, in contrast, an electron beam emitted from the electron emitting region 80 irradiates a vicinity of the electron emitting region 79.

Voltage waveforms such as those shown in FIGS. 10A and 10B are usable as another pulse pattern. In this case, pulse voltages which are $\pi/2$ different in phases from each other are applied to the device electrodes 73 and 74 respectively. This waveform pattern prevents an electron beam from being emitted from an electron emitting region while an electron beam is emitted from another electron emitting region and allows the electron source to receive the electron beam in a direction only, thereby preventing interference from taking place between electron beams which are emitted in two directions.

Furthermore, the present invention provides a manufacturing method described below which is capable of reducing characteristic variations between the devices caused due to the meandering of the second gap 16 produced at the forming step described above.

In other words, another embodiment of the present invention is configured to carry out the activation step described above directly between a pair of device electrodes (electrically conductive members) 12 and 13 having relatively excellent linearities without using the electrically conductive film 14 described above. FIG. 21A is a schematic plan view showing an electron-emitting device in this embodiment and FIG. 21B is a schematic sectional view of the electron-emitting device. FIGS. 22A, 22B and 23 are Schematic diagrams showing partial process of the manufacturing method described above. Herein, in the schematic diagrams shown in FIGS. 21A and 21B, a first gap 17 is traced in completely straight lines for easy understanding of the present invention. Further, though a carbon film 15 is completely separated taking the first gap 17 as a border in FIGS. 21A and 21B, the carbon film 15 may be partially connected. Accordingly, the carbon film 15 which is formed at the activation step described above may be a pair of carbon films 15 which are opposed to each other via the gap 17 or a carbon film 15 which has the gap 17.

The other manufacturing method described above according to the present invention is configured to dispose a pair of device electrodes (electrically conductive members) 12 and 13 on a substrate 11 with a gap L interposed (FIG. 22A). In this embodiment, the gap between the device electrodes 12 and 13 corresponds to the first gap 16 described above.

Then, the activation step according to the present invention is carried out. At this activation step, electron emitting means is separately disposed and the carbon film 15 is formed by applying a voltage to the electrodes 12 and 13 while irradiating either of regions (1) and (2) mentioned below with an electron beam emitted from the electron emitting means (FIGS. 22B and 23). In other words, the voltage is applied to the electrodes 12 and 13 simultaneously with irradiation with the electron beam from the electron emitting means.

The region to be irradiated with the electron beam described above is either:

(1) The substrate 11 between the device electrodes 12 and 13 described above or (2) The substrate 11 between the device electrodes 12 and 13 described above and the electrodes (12 and 13).

The embodiment is therefore capable of forming the carbon film 15 on the device electrodes 12 and 13 and the insulating substrate 11 between the device electrodes as well as the first gap 17 between the device electrodes 12 and 13.

FIG. 23 is a schematic diagram showing an apparatus for irradiation with an external electron beam. The electron irradiating apparatus shown in FIG. 23 has a configuration which is basically the same as that of the apparatus shown in FIG. 4. In FIG. 23, reference numeral 51 denotes electron emitting means. Though the electron emitting means 51 may be disposed in a vacuum vessel for electron-emitting device, it is possible as occasion demands to dispose the electron emitting means in a vacuum vessel separate from a vacuum vessel accommodating the substrate 11 and evacuate the electron emitting means differentially.

When the electron emitting means is to be evacuated differentially, a pinhole for electron beam permeation (52 in FIG. 23) is formed so that an internal pressure of the vacuum vessel accommodating the substrate 11 can be separated from an internal pressure of the vacuum vessel accommodating the electron emitting means 51 due to low conductance of the pinhole.

A structure which uses a thermionic cathode as an electron source and accelerates an electron beam by applying an accelerating voltage may be used as the electron emitting means 51. Furthermore, electron beam shielding means 53 may be disposed to delicately control the region irradiated with the electron beam.

The device electrodes 12 and 13 and/or the substrate 11 between the device electrodes may be irradiated with the electron beam like a DC voltage-or a pulse voltage in synchronization with a pulse voltage applied to the electrodes.

Accordingly, the present invention makes it unnecessary to use the electrically conductive film 14 (see FIGS. 1A and 1B) which is electrically connected to the device electrodes and the "forming" to form the second gap 16 in the electrically conductive film, which are required in the activation step.

In other words, the present invention makes it possible to dispose the carbon film 15 and the first gap 17 in a spacing L (several micrometers to scores of micrometers) between the electrodes which is far broader than the second gap 16, described above, by irradiation with the external electron beam. Furthermore, the second gap 16 formed in the device shown in FIGS. 21A and 21B corresponds to the spacing between the electrodes 12 and 13. The second embodiment therefore allows the second gap to be formed in the device so as to have a high linearity and a highly uniform width (L).

Accordingly, the second embodiment is capable of reducing the local variations of the electron emission characteristic in the electron-emitting device caused due to the ununiformity of the width of the second gap 16 described above and the ununiformities of distances from the device electrodes 12 and 13 to the second gap in the device shown in FIGS. 19A through 19D or FIG. 20. Furthermore, the second embodiment also exhibits an effect of the electron beam emission described above, thereby being capable of enhancing an electron emitting efficiency of the device and remarkably reducing a variation or deterioration of the characteristic during driving of the device.

Furthermore, the manufacturing method of electron-emitting device according to the present invention makes it unnecessary to use the electrically conductive film 14 which is electrically connected to the device electrodes or the "forming" to form the second gap 16 in the electrically conductive film which are required for the conventional activation step, thereby simplifying a configuration of the device and reducing a number of steps. In other words, the manufacturing method according to the present invention makes it possible to inexpensively and efficiently manufacture an electron-emitting device which has a stable and highly efficient electron emission efficiency. Furthermore, the manufacturing method according to the present invention makes it possible to provide an electron source and an image-forming apparatus which comprise the electron-emitting device described above arranged in a plurality on a substrate, and have highly uniform, highly efficient and stable characteristics.

At the activation step of the manufacturing method according to the present invention, in particular, it is preferable to apply the voltage to the device electrodes 12 and 13 while irradiating with the electron beam from the electron emitting means 41 (51). In other words, it is preferable to perform an irradiation with the electron beam emitted from the electron emitting means while the voltage is applied to the device electrodes 12 and 13. This technique permits enhancing a degree of crystallinity of the carbon and/or carbon compound which forms the first gap 17 at an initial stage of deposition. Speaking more concretely, compared with the conventional activation method, the carbon and/or carbon compound can be deposited as a carbon film having a high degree of crystallinity from the initial stage of deposition by a current supplied between the device electrodes 12 and 13 since electrons having a high energy are projected separately from the electron emitting means 41 (51). Therefore, for example, it can be expected that the gap 17 is formed with a narrower width, thereby forming a device having an excellent characteristic.

(Step E)

5) It is desirable to carry out an stabilization step for an electron-emitting device obtained through the activation step according to the present invention described above. This step is carried out to exhaust organic substances out of the vacuum vessel. For evacuating the vacuum vessel, it is preferable to use a vacuum evacuating apparatus which does not use an oil so that the oil will not influence on a characteristic of the device. Speaking concretely, a vacuum evacuating apparatus such as a sorption pump, an ion pump or the like can be used to evacuate the vacuum vessel.

When an oil diffusion pump or a rotary pump is used as an evacuating apparatus and an organic gas deriving from an oil component coming from the pump is used at the activation step described above, it is necessary to suppress a partial pressure of this component to a low level. It is preferable that a partial pressure of an organic component in the vacuum vessel is at a level not higher than $1\times10^{-6}$ Pa at which the carbon or carbon compound is scarcely deposited newly and it is more preferable that the partial pressure is at a level not higher than $1\times10^{-8}$ Pa in particular. At a stage to evacuate the vacuum vessel, it is preferable for to heat the vacuum vessel as a whole to facilitate to evacuate molecules of the organic substances which are adsorbed by an inside wall of the vacuum vessel and the electron-emitting device. It is desirable to evacuate the vacuum vessel at 80 to 300° C., preferably at 150° C. or higher, and for a time as long as possible, but these conditions are not limitative and the vacuum vessel is evacuated in conditions adequately selected dependently on conditions such as a size and a shape of the vacuum vessel, a configuration of the electron-emitting device and so on. It is necessary to evacuate the vacuum vessel to an extremely low level preferably not exceeding $1\times10^{-5}$ Pa, more preferably not exceeding $1\times10^{-6}$ Pa.

For driving after the stabilization step described above, it is preferable to maintain the atmosphere which remains after termination of the stabilization step, but this atmosphere is not limitative and a stable characteristic can be maintained so far as the organic substances have been sufficiently eliminated even when the pressure itself is more or less enhanced. By adopting such an atmosphere, it is possible to prevent the carbon or carbon compound from being newly deposited, thereby stabilzing the device current If and the emission current Ie.

Now, description will be made of basic characteristics of the electron-emitting device according to the present invention. FIG. 5 is a schematic diagram showing an apparatus to evaluate the basic characteristics of the electron-emitting device according to the present invention. This evaluating apparatus has functions of not only an evacuating system but also of a device characteristic measuring system. In FIG. 5, members which are the same as those shown in FIGS. 1A and 1B are denoted by reference numerals which are the same as those used in FIGS. 1A and 1B. Describing concretely, reference numeral 11 denotes a substrate which composes an electron-emitting device, reference numerals 12 and 13 designate electrodes, reference numeral 14 denotes an electrically conductive film, and reference numeral 100 denotes an electron emitting region. The carbon film 15 is omitted for convenience. In addition, reference numeral 51 denotes a power source which applies a device voltage Vf to the electron-emitting device, reference numeral 50 designates an ammeter which measures a device current If supplied through the electrically conductive film 14 between the electrodes 12 and 13, and reference numeral 54 denotes an anode which captures the emission current Ie emitted from an electron emitting region of the device. Reference numeral 53 denotes a high voltage power source which applies a voltage to the anode 54 and reference numeral 52 designates an ammeter which measures an emission current Ie emitted from an electron emitting region 16 of the device. The basic characteristics of the device according to the present invention were measured while applying a voltage of 1 kV to the anode and reserving a distance H of 2 mm between the anode and the electron-emitting device.

To measure the basic characteristics, a vacuum vessel is first evacuated to prevent carbon or a carbon compound from being newly deposited and a vacuum evacuating apparatus which does not use an oil, for example a sorption pump, is used as a vacuum evacuating apparatus 56 to evacuate a vacuum vessel 55 so that an oil coming from an apparatus will not influence on the characteristics of the device.

A partial pressure of organic components in the vacuum vessel 55 is set at a level not exceeding $1\times10^{-8}$ Pa at which the carbon and carbon compound described above are not newly deposited. At this time, it is preferable to heat the vacuum vessel to 200° C. or higher as a whole to facilitate to evacuate molecules of organic substances which have been adsorbed by an inside wall of the vacuum vessel and the electron-emitting device.

FIG. 6 is a diagram schematically showing relationship among the emission current Ie, the device current If and the device voltage Vf of the electronemitting device according to the present invention which were measured with the evaluating apparatus shown in FIG. 5. In FIG. 6, the emission current Ie is shown in an arbitrary unit since it is remarkably lower than the device current If.

As apparent also from FIG. 6, the electron-emitting device according to the present invention has three characteristic properties with regard to the emission current Ie as described below.

First, the electron-emitting device abruptly increases the emission current Ie when a device voltage exceeding a certain voltage level (referred to as a threshold voltage: Vth in FIG. 6), whereas the emission current Ie is scarcely emitted at a voltage level which does not exceed the threshold value voltage Vth. That is, the electron-emitting device according to the present invention is a non-linear device having the threshold voltage Vth which is clear relative to the emission current Ie.

Secondly, the emission current Ie can be controlled with the device voltage Vf since the emission current Ie increases monotonously with the device voltage Vf.

Thirdly, an amount of emitted electrons to be captured by the anode 54 (see FIG. 5) is dependent on a time to apply the device voltage Vf. In other words, the amount of electrons to be captured by the anode 54 can be controlled by the time to apply the device voltage Vf.

As understood from the foregoing description, the electron-emitting device according to the present invention has an electron emitting characteristic which can easily be controlled dependently on input signals. By utilizing this property, the electron-emitting device according to the present invention is applicable to a variety of appliances such as an electron source and an image-forming apparatus which are composed by arranging a plurality of electron-emitting devices.

Though FIG. 6 shows an example wherein the device current If also increases monotonously with the device voltage Vf (hereinafter referred to as "MI characteristic"), the device current If may exhibits a voltage control type negative resistance characteristic (hereinafter referred to as "VCNR characteristic) (not shown). These characteristics can be controlled by controlling the steps described above.

The electron-emitting device according to the present invention which has the characteristic properties described above makes it possible to easily control an amount of emitted electrons in the electron source or the image-forming apparatus composed by arranging a plurality of electron-emitting devices and can be applied to a variety of appliances.

Application examples of the electron-emitting device according to the present invention will be described below. An electron source or an image-forming apparatus can be composed by arranging the electron-emitting device according to the present invention in a plurality on a substrate.

A variety of arrangements of electron-emitting devices can be adopted. For example, there is a ladder type arrangement wherein a large number of electron-emitting devices are arranged in parallel and connected at ends on both sides, electron-emitting devices are arranged in a large number of lines (a line direction), and electrons from the electron-emitting devices are controlled and driven with control electrodes (grid electrodes) which are disposed in a direction (a row direction) perpendicular to the line direction and above the above described electron-emitting device. Separately from this arrangement, there is an arrangement wherein a plurality of electron-emitting devices are arranged in an X direction and a Y direction so as to form a matrix, a kind of electrodes of a plurality of electron-emitting devices arranged in a line are connected commonly to wires in the X direction, and the other kind of electrodes of a plurality of electron-emitting devices are connected commonly to wires in the Y direction. Such an arrangement is the so-called simple matrix arrangement. The simple matrix arrangement will be detailed below.

The electron-emitting device according to the present invention has the three characteristics as described above. Speaking concretely, electrons emitted from the electron-emitting device can be controlled with an amplitude and a width of a pulse voltage applied to the device electrodes opposed to each other so far as the voltage exceeds the threshold voltage. While the voltage does not exceed the threshold voltage, on the other hand, electrons are scarcely emitted from the electron-emitting device. This characteristic makes it possible to select electron-emitting devices and control an amount of emitted electrons dependently on input signals by applying an adequate pulse voltage to each of the electron-emitting device even when a large number of electron-emitting devices are arranged.

Referring to FIG. 12, description will be made of an electron source substrate which is obtained by arranging a plurality of the electron-emitting device according to the present invention. In FIG. 12, reference numeral 121 denotes an electron source substrate, reference numeral 122 designates wires in the X direction, reference numeral 123 denotes wires in the Y direction. Reference numeral 124 denotes the electron-emitting device according to the invention and reference numeral 125 designates a wiring.

The wires 122 which are arranged in a number of m in the X direction and consists of Dx1, Dx2, . . . Dxm can be composed of an electrically conductive metal or the like which are formed by the vacuum deposition method, printing method or sputtering process. A material, film thickness and width of the wires are designed adequately. The wires 123 which are arranged in a number of n in the Y direction consists of Dy1, Dy2, . . . Dyn and are formed similarly to the wires 122 in the X direction. Insulating layers (not shown) are formed between the m wires 122 in the X direction and the n wires 123 in the Y direction to electrically separate the wires 122 from the wires 123 (Both m and n are positive integers).

The insulating layers (not shown) are composed of $SiO_2$ or the like formed by the vacuum deposition method, printing method or sputtering process. The insulating layers are formed in a desired shape, for example, over an entire surface or portions of the substrate 121 on which the wires 122 are formed in the X direction, and thickness, a material and a manufacturing method of the layers are selected so that the layers are bearable of potential differences at intersections between the wires 122 in the X direction and the wires 123 in the Y direction. The wires 122 in the X direction and the wires 123 in the Y direction are pulled out as external terminals, respectively.

Pairs of device electrodes (not shown) which compose the electron-emitting devices 124 are electrically connected to the m wires 122 in the X direction and the n wires 123 in the Y direction via the wirings 125 made of an electrically conductive metal or the like.

All or some of component elements of materials which are used to compose the wires 122 in the X direction, the wires 123 in the Y direction, the wirings 125 and the pairs of the device electrodes may be the same or different from one another. These materials are selected adequately, for example, from among the materials for the device electrodes described above. When the material of the device electrodes is the same as that of the wires, the wires which are connected to the device electrodes may be said as the device electrodes.

The wires 122 in the X direction are connected to scanning signal applying means (not shown) which applies a scanning signal to select a line of the electron-emitting devices 124 arranged in the X direction. On the other hand, the wires 123 in the Y direction are connected to a modulation signal generating means (not shown) which modulates each row of the electron-emitting devices 124 arranged in the Y direction according to the input signal. A driving voltage is applied to each electron-emitting device as a differential voltage between the scanning signal and the modulation signal applied to the electron-emitting device.

The configuration described above makes it possible to select individual devices and drive the devices independently using a simple matrix wiring.

Referring to FIGS. 13, 14 and 15, description will be made of an image-forming apparatus which is configured using an electron source with such a simple matrix arrangement. FIG. 13 is a schematic diagram showing an example of a display panel of the image-forming apparatus and FIGS. 14A and 14B are schematic diagrams showing a fluorescent film used for the image-forming apparatus shown in FIG. 13. FIG. 15 is a block diagram exemplifying a driving circuit for display according to TV signals of an NTSC system. The members which are the same as those shown in FIG. 12 are denoted by the same reference numerals and not described in particular. The electrically conductive film 14 and the electrically conductive film 15 are omitted for convenience.

In FIG. 13, reference numeral 131 denotes a rear plate to which the electron source substrate 121 is fixed, and reference numeral 136 designates a face plate having a fluorescent film 134, a metal back 135 and so on which are formed on an inside surface of a glass substrate 133. Reference numeral 132 denotes a support frame to which the rear plate 131 and the face plate 136 are connected using fritted glass or the like. Reference numeral 138 denotes an enclosure which is composed by bonding, for example within a temperature range from 400 to 500° C. for 10 minutes or longer.

The enclosure 138 is composed of the face plate 136, the support frame 132 and the rear plate 131 as described above. Since the rear plate 131 is disposed mainly to reinforce the electron source substrate 121, the rear plate 131 is unnecessary when the substrate 121 itself has sufficient strength. Speaking concretely, the support frame 132 may be sealed directly to the substrate 121, and the enclosure 138 may be composed of the face plate 136, the support frame 132 and the substrate 121. On the other hand, the enclosure 138 can be composed so as to have sufficient strength to an atmospheric pressure by disposing a support member called a spacer (not shown) between the face plate 136 and the rear plate 131.

FIGS. 14A and 14B are schematic diagrams showing a fluorescent film. A fluorescent film 134 can be composed only of fluorescent materials when the film is monochromatic. A color fluorescent film can be composed of a black electrically conductive material 141 called black stripe (FIG. 14A) or black matrix (FIG. 14B) and fluorescent materials 142. The black stripe or the black matrix is disposed to make color mixtures not conspicuous by blackening coated borders among the fluorescent materials 142 of the three primary colors required for color display and prevent contrast from being lowered by external rays reflected by the fluorescent film 134. Usable as a material of the black electrically conductive material 141 is a substance which is electrically conductive and scarcely transmits or reflects rays in addition to a substrance having graphite as a main component which is ordinarily used.

A deposition method, printing method or the like can be adopted to apply the fluorescent materials to the glass substrate 133 whether the film is monochromatic or colored. A metal back 135 is ordinarily disposed on an inside surface of the fluorescent film 134. Purposes to dispose the metal back is to enhance luminance by specular reflection toward the glass substrate 133 rays which travel toward the inside surface out of rays emitted from the fluorescent material, to make the rays as an electrode for application of an electron beam accelerating voltage, to protect the fluorescent material from damage due to bombardment of negative ions produced in the enclosure, and so on. The metal back can be manufactured by carrying out a smoothing treatment (generally called "filming") of the inside surface of the fluorescent film after forming the fluorescent film and then depositing Al by vacuum deposition or the like.

Furthermore, the face plate 136 may contain a transparent electrode (not shown) which is disposed on an outside surface of the fluorescent film 134 to enhance electrical conductivity of the fluorescent film 134.

In case of the color fluorescent film, it is necessary to correspond the fluorescent material of each color to each electron-emitting device and sufficient positioning is indispensable at the sealing stage described above.

The image forming apparatus shown in FIG. 13 is manufactured, for example, as described below.

The enclosure 138 is sealed after its interior is evacuated while adequately heating with an evacuating apparatus such as the ion pump or the sorption pump which does not use an oil like the evacuation at the stabilization step described above until it is filled with an atmosphere which is at a vacuum degree on the order of $1\times10^{-5}$ Pa and contains sufficiently little organic substance. A getter treatment may be carried out to maintain the vacuum degree after sealing the enclosure 138. This is a treatment carried out to form a deposited film, after immediately before or after sealing the enclosure 138, by heating a getter (not shown) disposed at a predetermined location in the enclosure 138 with a resistance heater or a high-frequency heater. The getter ordinarily has a main component of Ba or the like and serves to maintain a high vacuum degree not lower than $1\times10^{-5}$ Pa, for example, by an adsorbing function of the deposited film.

In the next place, description will be made of a configurational example of a driving circuit for TV display with the TV signals of the NTSC system on a display panel composed using the electron source of the simple matrix arrangement as shown in FIG. 15. In FIG. 15, reference numeral 151 denotes a display panel, reference numeral 152 designates a scanning circuit, reference numeral 153 denotes a control circuit, reference numeral 154 denotes a shift register, reference numeral 155 designates a line memory, reference numeral 156 denotes a synchronizing signal separator circuit, reference numeral 157 denotes a modulating signal generator, and reference symbols Vx and Va designate DC voltage sources.

The display panel 151 is connected to external electric circuits via terminals Dx1 through Dxm, terminals Dy1 through Dyn and a high voltage terminal 137. Applied to the terminals Dx1 through Dxm are scanning signals to drive an electron source disposed in the display panel 151, that is, to sequentially drive line by line (n devices) a group of electron-emitting devices which are wired in a matrix of m lines and n rows. Applied to the terminals Dy1 through Dyn are modulating signals to control electron beams output from the electron-emitting devices in a line which is selected by the scanning signal. Supplied from the DC voltage source Va to the high voltage terminal 137 is a DC voltage, for example of 10 kV, which is an accelerating voltage to give the electron beam emitted from the electron-emitting device an energy sufficient to excite the fluorescent material.

Now, description will be made of the scanning circuit 152. This circuit comprises n switching elements (schematically denoted by Sl through Sm in FIG. 15). The switching elements select either an output voltage from the DC voltage source Vx or O [V] (ground level) and are electrically connected to the terminals Dx1 through Dxm on the display panel 151. The switching elements Sl through Sm operate on the basis of a control signal Tscan output from the control circuit 153 and can be composed, for example, by combining switching elements such as FETs.

On the basis of the characteristic of the electron-emitting device (the threshold value voltage for emission of electrons), the DC voltage source Vx is set to output such a constant voltage as to keep a driving voltage applied to a device which is not scanned lower than the threshold value voltage for emission of electrons.

The control circuit 153 has a function to match operations of the members so that an image is displayed adequately on the basis of image signals input from outside. The control circuit 153 generates control signals Tscan, Tsft and Tmry for the members on the basis of a synchronizing signal Tsync sent from the synchronizing signal separator circuit 156.

The synchronizing signal separator circuit 156 is a circuit which separates a synchronizing signal component and a luminance signal component from the TV signal of the NTSC system input from outside, and can be composed of a general frequency separator (filter) circuit. Though the synchronizing signal separated by the synchronizing signal separator circuit 156 consists of a vertical synchronizing signal and a horizontal synchronizing signal, the synchronizing signal is denoted as Tsync herein for convenience of description. The luminance signal component of an image separated from the TV signal is designated as DATA signal for convenience. This DATA signal is input into the shift register 154.

The shift register 154 is used for serial/parallel conversion, per line of an image, of the DATA signals described above which are input in time series and operates on the basis of the control signals Tsft sent from the control circuit 153 (in other words, it may be said that the control signal Tsft is a shift clock of the shift register 154). Data of a line of the image subjected to the serial/parallel conversion (corresponding to driving data for n electron-emitting devices) is output from the shift register 154 as n parallel signals Idl through Idn.

The line memory 155 is a memory which stores the data of a line of the image for a required time and stores contents of 1dl through 1dn adequately according to the control signal Tmry sent from the control circuit 153. Stored contents are output as Id'l through Id'n and input into the modulating signal generator 157.

The modulating signal generator 157 is a signal source which adequately drives and modulates each electron-emitting device in accordance with each image data Id'l through Id'n and output signals from the modulating signal generator 157 are applied to the electron-emitting devices in the display panel 151 via the terminals Dy1 through Dyn.

As already described above, the electron-emitting device according to the present invention has the following basic characteristics in the emission current Ie. That is, the electron-emitting device has the clear threshold value voltage Vth for emission of electrons and emits electrons only when a voltage higher than Vth is applied. At a voltage higher than the threshold value for emission of electrons, the emission current also varies dependently on variations of the applied voltage to the device. When a pulse voltage is applied to the electron-emitting device, the device therefor emits no electron when a voltage lower than the threshold value for emission of electrons is applied, but the device emits an electron beam when a voltage higher than the threshold value for emission of electrons is applied. At this stage, it is possible to control an intensity of the output electron beam by changing the crest value Vm of pulses. Furthermore, it is possible to control a total amount of electric charges of the output electron beam by changing the width Pw of the pulses.

Accordingly, a voltage modulation system, a pulse width modulation system and the like can be adopted as a system to modulate the electron-emitting device dependently on input signal. To adopt the voltage modulation system, usable as the modulating signal generator 157 is a voltage modulation type circuit which generates voltage pulses having a definite length and can adequately modulate the crest value of voltage pulses dependently on input data. To adopt the pulse width modulation system, usable as the modulating signal generator 157 is a pulse width modulation type circuit which generates voltage pulses having a definite crest value and adequately modulates a width of the voltage pulses dependently on the input data.

The shift register 154 and the line memory 155 may be of a digital signal type or a analog signal type. This is because the shift register and the line memory are sufficient so far as these member performs the serial/parallel conversion and storage of the image signals at predetermined speeds.

When digital signal type shift register and line memory are used, it is necessary to convert the output signal DATA from the synchronizing signal separator circuit 156 into digital signals and it is sufficient for this purpose to dispose an A/D converter in an output section of the synchronizing signal separator circuit 156. In relation to these signals, a circuit to be used as the modulating signal generator 157 is slightly different dependently on whether the line memory 155 outputs digital signals or analog signals. In case of the voltage modulation system which uses digital signals, a D/A converter circuit, for example, is used as the modulating signal generator 157 and amplifier circuit, etc. are added as occasion demands. In case of the pulse width modulation system, used as the modulating signal generator 157 is a circuit consisting of a combination, for example, of a high-speed oscillator, a counter which counts wavenumbers output from the oscillator and a comparator which compares an output value from the counter with an output value of the memory. It is possible as occasion demands to add an amplifier which performs voltage amplification of modulating signals which are modulated in pulse width and output from the comparator to the driving voltage for the electron-emitting device.

In case of the voltage modulation system which uses the analog signals, an amplifier circuit which uses an operation amplifier or the like, for example, is used as the modulation signal generator 157 and a level shift circuit or the like can be added as occasion demands. In case of the pulse width modulation system, a voltage control type oscillator circuit (VCO) can be adopted and an amplifier which performs voltage amplification to the driving voltage for the electron-emitting device can be added as occasion demands.

In the image-forming apparatus according to the present invention which can have the configuration described above, electrons are emitted by applying a voltage to the electron-emitting devices via the external terminals Dx1 through Dxm and Dy1 through Dyn of the enclosure. Simultaneously, an electron beam is accelerated by applying a high voltage to the metal back 135 or the transparent electrode (not shown) via the high voltage terminal 137. Accelerated electrons bombard the fluorescent film 134, which is glowed to form an image.

The configuration of the image-forming apparatus described above is an example of configuration of the image-forming apparatus according to the present invention and can be modified variously on the basis of the technique according to the present invention. Though the input signal of the NTSC system are described above, the input signals are not limitative and it is possible to adopt signals of a PAL system, a SECAM system or other TV signals having scanning lines in a larger number (for example, those of a high-definition TV such as a MUSE system).

Now, description will be made of the electron source and the image-forming apparatus of the ladder type arrangement described above with reference to FIGS. 16 and 17.

FIG. 16 is a schematic diagram exemplifying an electron source of the ladder type arrangement. In FIG. 16, reference numeral 160 denotes an electron source substrate and reference numeral 161 designates electron-emitting devices. Reference numeral 162 denotes common wires D1 through D10 to connect the electron-emitting devices 161 which are pulled out as external terminals. The electron-emitting devices 161 are arranged in a plurality in parallel in an X direction on the substrate 160 (referred to as device lines). The device lines are arranged in a plurality to compose the electron source. The device lines can be driven independently by applying driving voltages to the common wires. Speaking concretely, a voltage higher than the threshold value voltage for emission of electrons is applied to a device line which is to emit an electron beam and a voltage lower than the threshold value voltage for emission of electrons is applied to a device line which is not to emit an electron beam. D2 and D3, for example, of the common wires D2 through D9 among the device lines can be integrated into a single wire.

FIG. 17 is a schematic diagram exemplifying a panel structure of an image-forming apparatus which comprises the electron source of the ladder type arrangement. Reference numeral 170 denotes grid electrodes, reference numeral 171 designates openings through which electrons pass, reference symbols D1 through Dm denote external terminals of a casing, reference symbols G1 through Gn denote external terminals of the casing which are connected to the grid electrodes 170. The reference numeral 160 designates the electron source substrate on which the common wires are integrated between the device lines. In FIG. 17, members which are the same as those shown in FIGS. 13 and 16 are denoted by the same numerals and symbols. The electrically conductive film 14 and the electrically conductive film 15 are omitted for convenience. Largely different from the image-forming apparatus of the simple matrix arrangement shown in FIG. 13, the image-forming apparatus shown in FIG. 17 comprises the grid electrodes 170 which are disposed between the electron source substrate 160 and the face plate 136.

In FIG. 17, the grid electrodes 170 are disposed between the substrate 160 and the face plate 136. The grid electrodes 170 function to modulate electron beams emitted from the electron-emitting devices 161 and have the openings 171 which are formed circular in stripe-shaped electrodes disposed perpendicular to the device lines of the ladder type arrangement to pass electron beams. Herein, there is one opening 171 for each device. A shape and arrangement of the grid electrodes are not limited to those shown in FIG. 17. It is possible, for example, to form a large number of meshlike passage holes as the openings and dispose the grid electrodes around or in the vicinities of the electron-emitting devices.

The external terminals D1 through Dm and G1 through Gn of the casing are connected to a control circuit (not shown). Modulating signals for a line of an image are applied simultaneously to rows of the grid electrodes in synchronization with sequential scanning of the devices line by line. Accordingly, the image-forming apparatus is capable of displaying the image line by line by controlling irradiation of the fluorescent material with each electron beam.

Then image-forming apparatus according to the present invention described above is usable not only as a display apparatus for TV broadcasting, TV conference system or a computer but also as an image-forming apparatus composed as an optical printer using a photosensitive drum or the like.

FIG. 18 is a block diagram showing an example of the image-forming apparatus according to the present invention which is configured to be capable of displaying image data provided from various image data sources, for example, a TV broadcasting station.

In FIG. 18, reference numeral 1700 denotes a display panel, reference numeral 1701 designates a drive circuit for the display panel, reference numeral 1702 denotes a display controller, reference numeral 1703 denotes a multiplexer, reference numeral 1704 designates a decoder, reference numeral 1705 denotes an input/output interface circuit, reference numeral 1706 denotes a CPU, reference numeral 1707 designates an image generating circuit, reference numerals 1708 through 1710 denote image memory interface circuits, reference numeral 1711 denotes an image input interface circuit, reference numerals 1712 and 1713 designate TV signal receiving circuits, and reference numeral 1714 denotes an input unit.

When the image-forming apparatus receives signals such as TV signals containing both image data and voice data, for example, it reproduces voice while displaying an image as a matter of course, but description will not be made of circuits and a loudspeaker related to reception, separation, reproduction, processing, storage of the voice data which are not related directly to the characteristics of the present invention.

Now, description will be made of the circuits in a sequence of flows of image signals.

First, the TV signal receiving circuit 1713 is a circuit which receives TV signals transmitted, for example, through a radio transmission system such as a radio wave communication system or a spatial optical communication system. A system of the TV signals to be received is not limited in particular and may be, for example, the NTSC system, PAL system or the SECAM system. Furthermore, TV signals which consist of a larger number of scanning lines, for example, the so-called high-definition TV signals such as signals of the MUSE system are preferable to make use of merits of the display panel which is suited to have a large area and a large number of pixels.

The TV signals received by the TV signal receiving circuit 1713 are output to the decoder 1704.

Furthermore, the TV signal receiving circuit 1712 is a circuit which receives TV signals transmitted through a wire-link transmission system such as a coaxial cable or an optical fiber. Like the TV signal receiving circuit 1713, the TV signal receiving circuit 1712 does not limit a system of TV signals to be received and the TV signals received by the TV signal receiving circuit 1712 are output also to the decoder 1704.

The image input interface circuit 1711 is a circuit which takes image signals supplied from an image input unit such as a TV camera or an image reading scanner and image signals taken by this interface circuit are output to the decoder 1704.

The image memory interface circuit 1710 is a circuit which takes image signals stored in a video tape recorder (hereinafter referred to as "VTR") and image signals taken by this circuit are output to the decoder 1704.

The image memory interface circuit 1709 is a circuit which takes image signals stored in a video disk and image signals taken by this circuit are output to the decoder 1704.

The image memory interface circuit 1708 is a circuit which takes image signals from a unit which stores still image data like a still image disk and still image data taken by this circuit is input into the decoder 1704.

The input/output interface circuit 1705 is a circuit which connects the image-forming apparatus to an external output apparatus such as a computer, a computer network or a printer. This circuit is capable of inputting and outputting image data and character/figure data, and may allow input and output of control signals and numerical data between the CPU 1706 of the image-forming apparatus and an external apparatus.

The image generating circuit 1707 is a circuit which generates image data to be displayed on the basis of image data and character/figure data which are input from outside via the input/output interface circuit 1705 and image data and character/figure data which are output from the CPU 1706. Built in the image generating circuit 1707 are circuits which are necessary to generate images such as a rewritable memory for accumulating the image data and the character/figure data, a read only memory for storing image patterns corresponding to character codes and a processor for image processing.

Image data to be displayed which is generated by this circuit is output to the decoder 1704 and can be output, in a certain case, to the external computer network or printer via the input/output interface circuit 1705 described above.

The CPU 1706 mainly controls operations of the image-displaying apparatus and performs works related to generation, selection and edition of images to be displayed.

For example, the CPU 1706 outputs control signals to the multiplexer 1703, and adequately selects and combines image signals to be displayed on the display panel. At this stage, the CPU 1706 generates control signals for the display panel controller 1702 according to the image signals to be displayed, thereby adequately controlling operations of a display unit such as a screen display frequency, a scanning mode (for example, interlace or non-interlace) and a number of scanning lines on a screen. Furthermore, the CPU 1706 outputs the image data and character/figure data directly to the image generating circuit 1707, and makes access to the external computer or memory via the input/output interface circuit 1705 to input the image data and character/figure data.

In addition, the CPU 1706 may relates to works for other purposes. For example, it may have direct relation to a data generating function and a data processing function like a personal computer or a word processor. Alternately, the CPU 1706 may be connected to the external computer network via the input/output interface circuit 1705 so that the CPU performs works such as numerical calculations, for example, in cooperation with external equipment.

The input unit 1714 is operated by a user to input programs or data into the CPU 1706 and usable as the input unit 1714 is various input appliances, for example, not only a keyboard and a mouse but also a joystick, a bar code reader and a voice recognizer.

The decoder 1704 is a circuit which converts various image signals input from the image memory interface circuits 1707 through 1713 described above reversely into signals of the three primary colors or luminance signals, I signals and Q signals. It is desirable that the decoder 1704 comprises an image memory as indicated by a chain line in FIG. 18. An image memory is disposed to process TV signals such as those of the MUSE system which require an image memory for reverse conversion. Furthermore, an image memory facilitates to display a still image. An image memory provides merit to facilitate to perform image processings and edition such as omission, supplementation, expansion, contraction and synthesis of images as well as edition of images in cooperation with the image generating circuit 1707 and the CPU 1706.

The multiplexer 1703 adequately selects images to be displayed on the basis of control signals input from the CPU 1706. Speaking concretely, the multiplexer 1703 selects desired image signals out of the reversely converted image signals which are input from the decoder 1704 and outputs selected image signal to the drive circuit 1701. At this stage, the multiplexer 1703 is capable of selecting the image signals while switching the image signals within a display time for a scene so that the screen is divided into a plurality of regions and different images are displayed on the regions as those on the so-called multi-screen TV.

The display panel controller 1702 is a circuit which controls operations of the drive circuit 1701 on the basis of control signals input from the CPU 1706 described above.

In relation to basic operations of the display panel, signals to control an operating sequence of a driving power source (not shown) for the display panel, for example, are output to the drive circuit 1701. In relation to a driving method of the display panel, signals to control the screen display frequency and a scanning mode (for example, the interlace or noninterlace), for example, are output to the drive circuit 1701. Furthermore, control signals related to adjustment of image qualities such as luminance, color tones or sharpness of the images to be displayed contrast, may be output to the drive circuit 1701.

The drive circuit 1701 is a circuit which generates driving signals to be applied to the display panel 1700, and operates on the basis of the image signals input from the multiplexer 1703 described above and the control signals input from the display panel controller 1702 described above.

With the circuits having the functions described above, the image-forming apparatus which has the configuration shown in FIG. 18 is capable of displaying image data input from various image data sources on the display panel 1700. Speaking concretely, various kinds of image signals such as those of TV broadcasting are reversely converted by the decoder 1704, selected adequately by the multiplexer 1703 and input into the drive circuit 1701. On the other hand, the display controller 1702 generates control signals to control the operations of the drive circuit 1701 dependently on the image signals to be displayed. The drive circuit 1701 applies the driving signals to the display panel 1700 on the basis of the image signals described above and the control signals. Accordingly, the display panel displays an image. A series of these operations are controlled collectively by the CPU 1706.

The image-forming apparatus is capable of not only displaying data selected from the data in the image memory built in the decoder 1704 and the image generating circuit 1707 described above, but also, for the image information to be displayed, performing image processings such as the expansion, contraction, rotation, movement, edge emphasis, omission, supplementation, color conversion and aspect ratio conversion of images as well as edition such as synthesis, erasion, connection, exchange and fitting of images. Furthermore, circuits exclusively for processing and edition of voice data may also be disposed like those for the image processing and the image edition.

Accordingly, the image-forming apparatus can have collective functions usable as a display appliance for TV broadcasting, a terminal appliance for TV conferences, an image edition appliance to process still images and moving images, a terminal appliance for a computer, a business terminal appliance such as a word processor and a game appliance, thereby being applicable widely in industrial fields and for purposes of public welfare.

FIG. 18 shows only an example of a case wherein the image-forming apparatus uses the display panel which is composed of the electron-emitting devices as an electron beam source and it is needless to say that the image-forming apparatus according to the present invention is not limited to that shown in FIG. 18.

It is allowed to omit, for example, circuits which are not related to purposes unnecessary for purposes of use out of component members shown in FIG. 18. Reversely, additional component members may be used dependently on purposes of use. When the image-forming apparatus is to be used as a TV telephone, for example, it is preferable to add a transception circuit which comprises a TV camera, voice microphone, an illuminator and a modem.

The image-forming apparatus which uses the electron-emitting devices as the electron source facilitates to thin a display panel and can have a reduced depth of the image-forming apparatus. In addition, the display panel which uses the electron-emitting devices as the electron beam can easily have a large screen, high luminance and a large angle of view, whereby the image-forming apparatus is capable of displaying an image which is full of a feeling of presence and high appealing power with good legibility.

(Example 1)

An electron-emitting device which has the configuration shown in FIGS. 1A and 1B was manufactured as Example 1 of the present invention. Example 1 will be described with reference to FIGS. 1A, 1B and 2A through 2D. Silica glass was used as the substrate 11, and Pt was used as a material of the device electrodes taking stability to humidity and stability to oxidation into consideration. Furthermore, thickness of the electrically conductive film 14 was set at 30 nm taking a resistance value between the device electrodes 12 and 13 into consideration. L was 20 μm, W was 100 μm and film thickness d was 10 nm in Example 1.

The electrically conductive film 14 was formed by coating the substrate 11 disposed the electrodes 12 and 13 with an organic Pd solution ("ccp-4230" prepared by Okuno Chemical Industries Co., Ltd.) to form an organometal film, heating the film for calcination and patterning the film (FIGS. 2A and 2B).

Then, a triangular wave pulse shown in FIG. 3 was applied repeatedly with a pulse height kept constant. Pulse width T1 and pulse interval T2 shown in FIG. 3 were set at 100 μsec and 1 msec respectively, and the amplitude of the triangular wave was set at 10 V. In these conditions, the second gap 16 was formed by applying a pulse voltage for 600 seconds (FIG. 2C).

Then, the device described above was subjected to the activation treatment. Speaking concretely, a substrate on which the device was formed was placed in the apparatus shown in FIG. 4, acetone was introduced as an organic substance gas into sufficiently evacuated vacuum with an ion pump or the like and maintained at $1\times10^{-5}$ Pa, and the voltage was applied to the electrodes (12, 13) with a triangular wave pulse which was the same as that for forming the second gap 16 and irradiated with an electron beam at an accelerating voltage of 20 kV. However, a pulse width, a pulse interval and a pulse height of the triangular wave pulse were set at 1 msec, 10 msec and 15 V respectively.

The activation treatment, that is, the forming step of the carbon films 15, was carried out until the predetermined device current If was reached. Transmission electron microscopy of a section of an obtained device indicated film thickness of 50 nm in the vicinity of the gap 17. In addition, the carbon films 15 were opposed to each other with the first gap 17 interposed as shown in FIG. 2D. Furthermore, the first gap 17 was narrower than the second gap 16 and disposed in the second gap 16. Furthermore, Raman spectroscopy indicated that the carbon films 15 contained a graphite structure and had a high crystallization.

Furthermore, it was found out that no region having high resistance did not exist in the carbon films 15 as a result of observation through an interatomic force/tunnel microscope having an interatomic force microscope probe which was made electrically conductive so that an electrical conductivity distribution of a sample could be measured with the sample kept in contact with the probe. Furthermore, the probe was kept in contact with the carbon films 15 disposed on the electrically conductive film 14 during the measurement. An evaluation of specific resistance in a direction of width of the film provided a result not higher than 0.001 Ωm. Comparison of this value with that of a carbon film 15 which was formed without irradiation with electrons indicated a variation exceeding a place.

The device substrate described above was placed in the evaluating apparatus shown in FIG. 5 and its electron emission efficiency was measured by applying a voltage of 1 kV to an anode with the distance H between the anode and the electron-emitting device set at 2 mm.

First, the organic substance gas was evacuated from the vacuum vessel 55 to prevent carbon or a carbon compound from being newly deposited. A sorption pump was used as the vacuum evacuating apparatus 56 which evacuates the vacuum vessel 55 without using oil so that oil coming from the apparatus would not influence on the characteristic of the device. A partial pressure of an organic component in the vacuum vessel 55 was adjusted to a level not exceeding $1\times10^{-8}$ Pa at which carbon or the carbon compound is newly deposited scarcely. At this stage, the vacuum vessel is heated as a whole at a temperature not lower than 200° C. to facilitate to exhaust molecules of the organic substance adsorbed by an inside wall of the vacuum vessel and the electron-emitting device.

As a result, relationship between the device current If and the emission current Ie shown in FIG. 6 was obtained. Furthermore, an electron emission efficiency η was defined as a ratio of Ie relative to If with Vf and Va fixed to 15 V and 1 kV respectively and variations of η with time were measured in a condition where electrons are emitted.

As a result, an initial electron emission efficiency was enhanced 0,05% or more. Furthermore, the variations of η with time were remarkably suppressed as compared with those of the electron-emitting device which was manufactured by the conventional manufacturing method. The conventional device exhibited enhancement of η at a ratio of 0.01%/1000 h (h denotes hours) in a case where initial η was 0.1%, whereas the electron-emitting device manufactured by the method according to the present invention suppressed a variation ratio of η below 1/5.

(Example 2)

As Example 2 of the present invention, an electron source which has the configuration shown in FIGS. 7A and 7B was manufactured through the activation step shown in FIGS. 9A and 9B.

In Example 2, basical configuration, materials and a manufacturing method were the same as those in Example 1, but L1, W and film thickness of an electrode was set at 5 μm, 100 μm and 10 nm respectively. Furthermore, width L2 of the common device electrode was set at 5 μm.

An electron-emitting device was formed through steps similar to those in Example 1 before formation of an electron emitting region. Then, the activation treatment was carried out by applying a pulse voltage in FIGS. 8A and 8B across the device electrodes 73 and 74 with the common device electrode set at a ground potential. In Example 2, acetone was introduced as an organic substance and kept at $1\times10^{-5}$ Pa. The pulse width t1, the pulse voltage and the pulse interval t2 were set at 1 msec, 15 V and 200 msec respectively as conditions for applying the pulse voltage. Formation of the electrically conductive films 76 and 78 was continued until the device current If reached the predetermined level.

Transmission electron microscopy of a device thus obtained indicated that the carbon films 76 and 78 had thickness of 50 nm in the vicinities of the first gap 17 which composed the electron emitting region. Observations by the transmission microscopy and Raman spectroscopy of the obtained electron-emitting device indicated that the carbon films 76 and 78 contained graphite structures and had a high crystallization.

Furthermore, it was found out that no region having high resistance did not exist in the carbon films 76 and 78 as a result of observation through an interatomic force/tunnel microscope having a probe of an interatomic force microscope which was made electrically conductive as in Example 1 so that the microscope can measure an electrical conductivity distribution of a sample. Furthermore, an evaluation of specific resistance in a direction of width provided a result not exceeding 0.0001 Ωm. Comparison of this value with that measured in a case where carbon films are formed without irradiation with electrons indicated a variation exceeding two places.

The electron-emitting device which was formed as described above was placed in the evaluating apparatus shown in FIG. 5 and its electron emission efficiency was checked. However, drive was effected only on en electron emitting region. The common device electrode was set at a high potential so that electrons were emitted always toward the common device electrode. Defining an electron emission efficiency η as a ratio of Ie relative to If, variations of η with time were measured in a condition where electrons are emitted with Vf and Va fixed to 15 V and 1 kV respectively.

As a result, an initial electron emission efficiency was first enhanced 0.1% or more. Furthermore, the electron-emitting device remarkably suppressed the variations of η with time as compared with those of the electron-emitting device manufactured by the conventional manufacturing method. The conventional device exhibited enhancement of η at a ratio of 0.01%/1000 h (h denotes hours) in a case where initial η was 0.1%, whereas the electron-emitting device manufactured by the manufacturing method according to the present invention suppressed a variation ratio η below 1/10.

(Example 3)

In Example 3, an electron-emitting device having the configuration shown in FIGS. 21A and 21B was manufactured. Example 3 will be described with reference to FIGS. 21A, 21B, 22A, 22B and 23. Quartz was used as the substrate 11, and Pt was used as a material for the device electrodes 12 and 13 taking stability to humidity and stability to oxidation into consideration.

Then, the activation process was effected on the device.

Speaking concretely, a substrate on which the device electrodes 12 and 13 were formed was placed in the apparatus shown in FIG. 23, acetone was introduced as an organic substance gas into vacuum sufficiently evacuated with an ion pump or the like and maintained at $1\times10^{-5}$ Pa, and pulses shown in FIG. 8A were applied across the electrodes 12 and 13. T1 and t2 shown in FIG. 8A were set at 1 msec and 10 msec respectively. Simultaneously, the substrate was irradiated with an electron beam with an accelerating voltage set at 2 kV.

Forming step of the carbon film 15 was carried out until the device current If reached the predetermined level. Observation by the transmission electron microscopy of a device obtained indicated that the first gap 17 was formed between the device electrodes 12 and 13 as shown in FIGS. 21A and 21B, and that the carbon film 15 was formed continuously over the electrodes 12 and 13. The gap 17 was located near in the middle between the electrodes 12 and 13. Furthermore, observation by Raman spectroscopy provided a result that the carbon film 15 contains a graphite like layer structure and had high crystallization.

The electron-emitting device was placed in the evaluating apparatus shown in FIG. 5 and its electron emission efficiency was measured with an anode voltage kept by 1 kV and with the distance H between the anode and the electron-emitting device set at 2 mm.

First, the organic substance evacuated from the vacuum vessel to prevent carbon or a carbon compound from being newly deposited. In order to prevent the characteristic of the device from being influenced by oil coming from an apparatus, a sorption pump which used no oil was adopted as the vacuum evacuating apparatus 66 for evacuating the vacuum vessel 65. A partial pressure of an organic compound in the vacuum vessel 65 was adjusted to a level not exceeding $1\times10^{-8}$ Pa at which carbon or the carbon compound is newly deposited scarcely. At this stage, the vacuum vessel was heated as a whole at 200° C. or higher to facilitate to evacuate molecules of the organic substance adsorbed by an inside wall of the vacuum vessel and the electron-emitting device.

As a result, relationship between the device current If and the emission current Ie shown in FIG. 6 was obtained. Defining an electron emission efficiency $\eta$ as a ratio of Ie relative to If, initial values of If, Ie and $\eta$, variations of the initial values and variations of the initial values with time were measured with in a condition where electrons are emitted with Vf and Va kept fixed to 15 V and 1 kV respectively.

(Example 4)

In Example 4, the image-forming apparatus 138 shown in FIG. 13 was manufactured by the method described in Example 3. In addition, the substrate 121 served also as the rear plate 131.

First, 500 pairs of the device electrodes 12 and 13 and 1000 pairs of the device electrodes 12 and 13 were formed in the X direction and the Y direction respectively on the glass substrate 121 by an offset printing method (FIG. 24A). Successively, 500 wires 122 to be connected to the electrodes 12 were formed in the X direction by a screen printing method (FIG. 24B). 1000 insulating layers 124 were formed in a direction substantially perpendicular to the X direction by the screen printing method (FIG. 24C). 1000 wires were 123 formed in the Y direction on the insulating layers 124 so that the wires are connected to the electrodes 13 (FIG. 25D). As in Example 3, the carbon film 15 was formed as shown in FIG. 23 by applying a voltage across the device electrodes 12 and 13 while irradiating a portion between the device electrodes 12 and 13 with an electron beam like a DC voltage from the electron emitting means 51 (FIGS. 25E and 23). An electron source was formed through processes described above.

Successively, the electron source was positioned to the face plate 136 on which the fluorescent material 142 is arranged as an image forming member as shown in FIG. 14A, and the outer frame 132 having a preliminarily disposed joining member was disposed between the electron source and the face plate and sealed by heating and pressing the frame in the atmosphere of vacuum.

The image-forming apparatus 138 was manufactured through the processes described above.

When the image-forming apparatus was connected to the drive circuit shown in FIG. 15 and driven, it was capable of displaying an image having high luminance and uniformity stably for a long time.

(Example 5)

In Example 5, the image-forming apparatus 138 shown in FIG. 13 was manufactured by the manufacturing method in Example 1. In addition, in Example 5, the substrate 121 served also as the rear plate 131.

First, 500 pairs of the device electrodes 12 and 13 and 1000 pairs of the device electrodes 12 and 13 were formed in the X direction and the Y direction respectively on the glass substrate 121 by the offset printing method (FIG. 24A). Successively, 500 wires 122 to be connected to the electrodes 12 were formed in the X direction by the screen printing method (FIG. 24B). 1000 insulating layers 124 were formed in a direction substantially perpendicular to the X direction by the screen printing method (FIG. 24C). 1000 wires 123 were formed in the Y direction on the insulating layers 124 so that the wires are connected to the electrodes 13 (FIG. 26D). The electrically conductive film 14 was formed between the device electrodes 12 and 13 by an ink-jet method (FIG. 26E). As in Example 1, the second gap 16 was formed in a portion between the device electrodes 12 and 13 at the forming step by applying a voltage to the device electrodes 12 and 13 (FIG. 26F). The carbon film 15 was formed as shown in FIGS. 2A through 2D and FIG. 4 by applying a voltage to the device electrodes 12 and 13 while irradiating a portion between the device electrodes 12 and 13 an electron beam like a DC voltage from the electron emitting means 51. An electron beam source was manufactured through the processes described above.

Successively, the electron beam was positioned to the face plate 136 on which the fluorescent material 142 is disposed as an image forming member as shown in FIG. 14A, and the outside frame 132 having a preliminarily disposed joining member was arranged between the electron source and the face plate and sealed by heating and pressing the frame in the atmosphere of vacuum.

The image-forming apparatus 138 was manufactured through the processes described above.

When the image-forming apparatus was connected to the drive circuit shown in FIG. 15 and driven, the apparatus was capable of displaying a highly luminant and uniform image stable for a long time.

The manufacturing method of an electron-emitting device according to the present invention is capable of forming a carbon film which has low resistance and high uniformity since the method permits forming the carbon film having carbon as a main component while irradiating it with sufficient electrons. Accordingly, the manufacturing method according to the present invention enhances an initial electron emission efficiency and restrain physical properties of the carbon film from being changed even when the carbon film is irradiated with electrons emitted from an electron emitting region during driving, thereby making it possible to manufacture an electron-emitting device which is free from variations of the electron emission efficiency.

Accordingly, the present invention makes it possible to provide an electron source having a high, stable and uniform electron emission efficiency, and to manufacture a highly luminant and reliable image-forming apparatus using the electron source.

What is claimed is:

1. A manufacturing method of an electron-emitting device comprising the steps of:

disposing an electrically conductive member having a gap on a substrate; and applying a voltage to said electrically conductive member while irradiating at least said gap with an electron beam from electron emitting means disposed apart from said electrically conductive member in an atmosphere comprising a carbon compound.

2. A manufacturing method of an electron-emitting device comprising the steps of:

disposing first and second electrically conductive members on a substrate with a gap interposed; and applying a voltage to said first and second electrically conductive members while irradiating at least said gap with an electron beam from electron emitting means disposed apart from said electrically conductive members in an atmosphere comprising a carbon compound.

3. A manufacturing method of an electron-emitting device comprising the steps of:

disposing an electrically conductive member having a gap on a substrate; and irradiating at least said gap with an electron beam from electron emitting means disposed apart from said electrically conductive member in an atmosphere comprising a carbon compound within a period where a voltage is applied to said electrically conductive member.

4. A manufacturing method of an electron-emitting device comprising the steps of:

disposing first and second electrically conductive members on a substrate with a gap interposed; and irradiating at least said gap with an electron beam from electron emitting means disposed apart from said electrically conductive members in an atmosphere comprising a carbon compound within a period where a voltage is applied to said first and second electrically conductive members.

5. The manufacturing method of an electron-emitting device according to claim 1 or 3, wherein said electrically conductive member having said gap is an electrically conductive film which connects a pair of electrodes to each other and has said gap in a portion of the electrically conductive film.

6. The manufacturing method of an electron-emitting device according to claim 2 or 4, wherein said electrically conductive members are a pair of electrodes which are disposed with said gap interposed.

7. The manufacturing method of an electron-emitting device according to claim 2 or 4, wherein said electrically conductive members are a first electrically conductive film and a second electrically conductive film which are connected to first and second electrodes disposed apart respectively and are disposed with said gap interposed.

8. The manufacturing method of an electron-emitting device according to any one of claims 1 through 4, wherein said applied voltage is a pulse-like voltage.

9. The manufacturing method of an electron-emitting device according to any one of claims 1 through 4, wherein said electron beam is at an energy level not lower than 1 keV and not higher than 20 keV.

10. A manufacturing method of an electron source having a plurality of electron-emitting devices, wherein said electron-emitting device is manufactured by the manufacturing method according to any one of claims 1 through 4.

11. A manufacturing method of an image-forming apparatus having an electron source and an image forming member, wherein said electron source is manufactured by the manufacturing method according to claim 10.

12. A manufacturing method of an electron-emitting device, comprising the steps of:

disposing a first electrically conductive member and a second electrically conductive member so as to form a gap therebetween, on a substrate;

irradiating at least said gap with an electron beam from electron emitting means disposed apart from said first and second electrically conductive members, within an atmosphere containing a carbon compound; and applying a voltage to said first and second electrically conductive members.

13. A manufacturing method of an electron-emitting device, comprising the steps of:

disposing an electrically conductive member having a gap, on a substrate;

irradiating at least said gap with an electron beam from electron emitting means disposed apart from said electrically conductive member, within an atmosphere containing a carbon compound; and applying a voltage to said electrically conductive member.

14. A manufacturing method of an electron-emitting device, comprising the steps of:

disposing a first electrically conductive member and a second electrically conductive member so as to form a gap therebetween, on a substrate;

irradiating at least said gap with an electron beam from electron emitting means disposed apart from said first and second electrically conductive members, within an atmosphere containing a carbon compound; and applying a voltage to said first and second electrically conductive members, within the atmosphere containing the carbon compound.

15. A manufacturing method of an electron-emitting device, comprising the steps of:

disposing an electrically conductive member having a gap, on a substrate;

irradiating at least said gap with an electron beam from electron emitting means disposed apart from said electrically conductive member, within an atmosphere containing a carbon compound; and applying a voltage to said electrically conductive member, within the atmosphere containing the carbon compound.

* * * * *

UNITED STATES PATENT AND TRADEMARK OFFICE

CERTIFICATE OF CORRECTION

PATENT NO. : 7,067,336 B1
APPLICATION NO. : 09/506289
DATED : June 27, 2006
INVENTOR(S) : Masafumi Kyogaku et al.

It is certified that error appears in the above-identified patent and that said Letters Patent is hereby corrected as shown below:

ON COVER PAGE AT (56) OTHER PUBLICATIONS

Insert: --Patents Abstracts of Japan, Vol. 14, No. 108 (1990).--, and
After: "C.A. Spindt et al.": "Cases"," should read --Cones",--.

ON COVER PAGE AT (56) FOREIGN PATENT DOCUMENTS

Insert: --JP H09-35620 2/1997--; and
"9-102267 4/1915" should read --9-102267 4/1997--.

COLUMN 2

Line 28, "to" should read --to a--;
Line 31, "comprising" should read --comprised--;
Line 32, "is" should read --and--;
Line 37, "conventional" should read --a conventional--;
Line 43, "electrodes. (FIG. 19B)" should read --electrodes (FIG. 19B).--; and
Line 67, "compounds." should read --compound.--.

COLUMN 4

Line 6, "of" (first occurrence) should read --of a--;
Line 18, "FIG. 5a" should read --FIG. 5 is a--;
Line 22, "relationship" should read --a relationship--;
Line 36, "an" should be deleted; and
Line 66, "the" (first occurrence) should read --of the--.

COLUMN 5

Line 42, "application," should read --an application--; and
Line 54, "comprising" should read --comprised--.

COLUMN 6

Line 3, "comprising" should read --comprised--;
Line 25, "efficiency" should read --efficiency, which--; and
Line 33, "comprising" should read --comprised--.

UNITED STATES PATENT AND TRADEMARK OFFICE

CERTIFICATE OF CORRECTION

PATENT NO. : 7,067,336 B1 
APPLICATION NO. : 09/506289
DATED : June 27, 2006
INVENTOR(S) : Masafumi Kyogaku et al.

It is certified that error appears in the above-identified patent and that said Letters Patent is hereby corrected as shown below:

COLUMN 9

Line 1, "10 m sec" should read --10 msec--;
Line 3, "hight" should read --height--; and
Line 16, "is" should read --and is--.

COLUMN 11

Line 49, "of" should read --of an--.

COLUMN 12

Line 12, "electron" should read --electrons--.

COLUMN 13

Line 23, "each" should read --reach--;
Line 26, "establishes" should read --is established--; and
Line 45, "n in" should read --π in--.

COLUMN 14

Line 24, "Schematic" should read --schematic--; and
Line 67, "for" should read --for an--.

COLUMN 15

Line 19, "voltage-or" should read --voltage or--.

COLUMN 18

Line 18, "exhibits" should read --exhibit--.

COLUMN 20

Line 48, "substrance" should read --substance--.

COLUMN 23

Line 9, "member performs" should read --members perform--.

UNITED STATES PATENT AND TRADEMARK OFFICE

CERTIFICATE OF CORRECTION

PATENT NO. : 7,067,336 B1 
APPLICATION NO. : 09/506289
DATED : June 27, 2006
INVENTOR(S) : Masafumi Kyogaku et al.

It is certified that error appears in the above-identified patent and that said Letters Patent is hereby corrected as shown below:

<u>COLUMN 24</u>

Line 61, “Then” should read --Then the--.

<u>COLUMN 25</u>

Line 19, “voice” should read --voice data--.

<u>COLUMN 26</u>

Line 38, “relates” should read --relate--.

<u>COLUMN 27</u>

Line 52, “edition” should read --editions--.

<u>COLUMN 29</u>

Line 60, “basical” should read --basic--.

<u>COLUMN 30</u>

Line 35, “en” should read --an--.

Signed and Sealed this

Thirteenth Day of February, 2007

JON W. DUDAS
*Director of the United States Patent and Trademark Office*